(12) United States Patent
Tsutsui et al.

(10) Patent No.: US 10,949,595 B2
(45) Date of Patent: Mar. 16, 2021

(54) LAYOUT DESIGN SYSTEM AND LAYOUT DESIGN METHOD

(71) Applicant: SEMICONDUCTOR ENERGY LABORATORY CO., LTD., Atsugi (JP)

(72) Inventors: Naoaki Tsutsui, Kanagawa (JP); Yusuke Koumura, Kanagawa (JP); Yuji Iwaki, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/622,054

(22) PCT Filed: Jun. 14, 2018

(86) PCT No.: PCT/IB2018/054348
§ 371 (c)(1),
(2) Date: Dec. 12, 2019

(87) PCT Pub. No.: WO2018/234945
PCT Pub. Date: Dec. 27, 2018

(65) Prior Publication Data
US 2020/0184137 A1    Jun. 11, 2020

(30) Foreign Application Priority Data
Jun. 22, 2017 (JP) .............................. JP2017-122541

(51) Int. Cl.
*G06F 30/392* (2020.01)
*G06N 3/08* (2006.01)
(Continued)

(52) U.S. Cl.
CPC ............ *G06F 30/392* (2020.01); *G06F 30/27* (2020.01); *G06N 3/04* (2013.01); *G06N 3/0454* (2013.01); *G06N 3/08* (2013.01)

(58) Field of Classification Search
CPC ......... G06F 30/392; G06F 30/27; G06N 3/08; G06N 3/0454; G06N 3/04
(Continued)

(56) References Cited

U.S. PATENT DOCUMENTS 9,792,397 B1 * 10/2017 Nagaraja ................ G06F 30/327
10,061,276 B2 * 8/2018 Funakubo ............... H02P 23/12
(Continued)

FOREIGN PATENT DOCUMENTS

JP        2015-148926 A    8/2015

OTHER PUBLICATIONS

Takadama.K et al., "Printed Circuit Board Design via Organizational-Learning Agents", Applied Intelligence, Jul. 1, 1998, vol. 9, pp. 25-37, Kluwer Academic Publishers.
(Continued)

*Primary Examiner* — Sun J Lin
(74) *Attorney, Agent, or Firm* — Fish & Richardson P.C.

(57) ABSTRACT

A system performs a layout design of a circuit for a small area satisfying a design rule within a short period of time. In a layout design system which includes a processing portion and in which a circuit diagram and layout design information are input to the processing portion, the processing portion has a function of generating layout data from the circuit diagram and the layout design information by performing a Q learning, the processing portion has a function of outputting the layout data, the processing portion includes a first neural network, and the first neural network estimates an action value function in the Q learning.

14 Claims, 32 Drawing Sheets

(51) Int. Cl.
*G06N 3/04* (2006.01)
*G06F 30/27* (2020.01)

(58) Field of Classification Search
USPC .......................................... 716/110, 118, 119
See application file for complete search history.

(56) References Cited

U.S. PATENT DOCUMENTS

2015/0100530 A1    4/2015  Mnih et al.
2016/0343452 A1   11/2016  Ikeda et al.
2018/0246478 A1*   8/2018  Takakura et al. ........ G06N 3/04

OTHER PUBLICATIONS

Manimegalai.R et al., "Placement and Routing for 3D-FPGAs using Reinforcement Learning and Support Vector Machines", VLSI Design, Jan. 3, 2005, pp. 451-456, IEEE.
International Search Report (Application No. PCT/IB2018/054348) dated Oct. 2, 2018.
Written Opinion (Application No. PCT/IB2018/054348) dated Oct. 2, 2018.

* cited by examiner

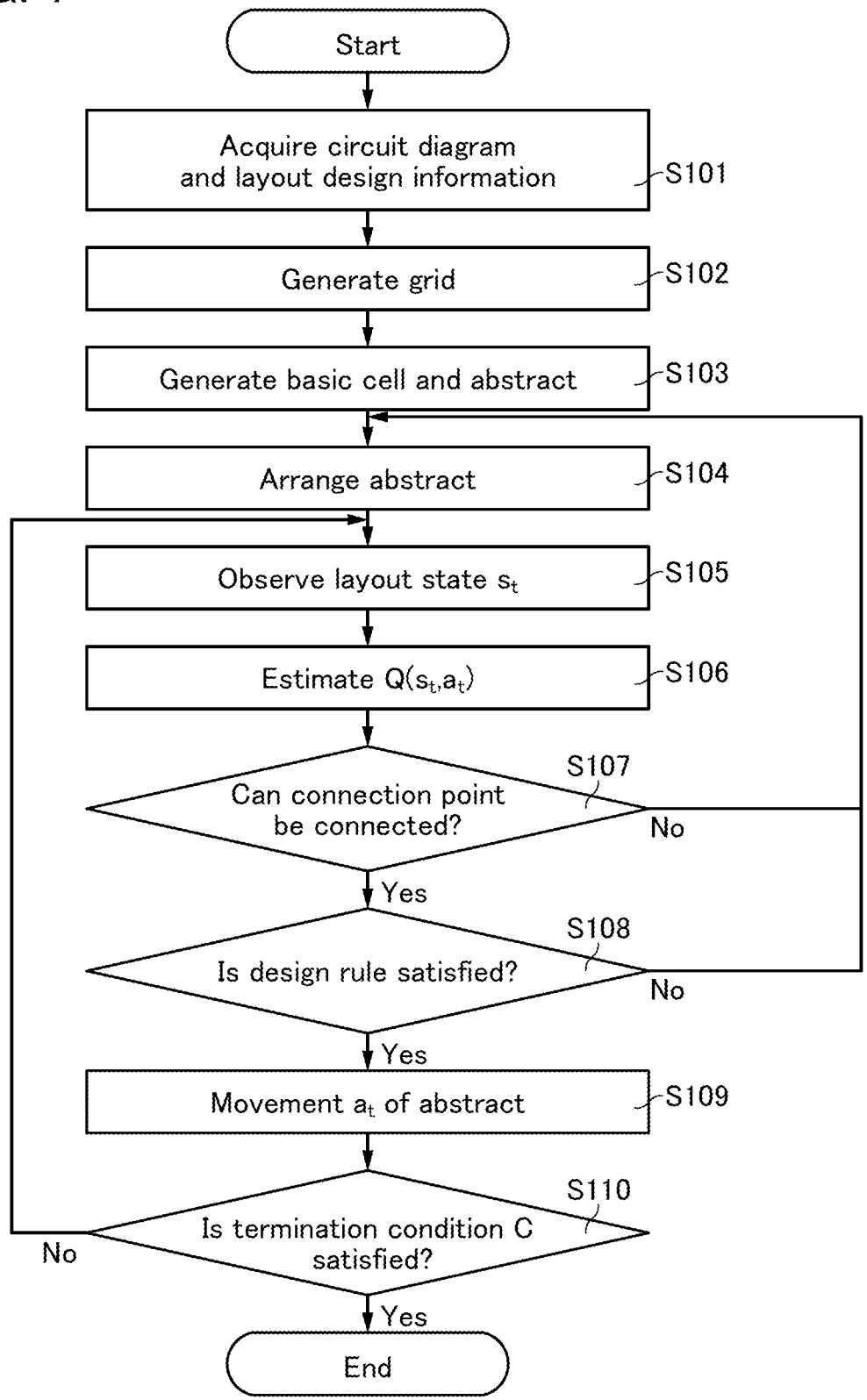

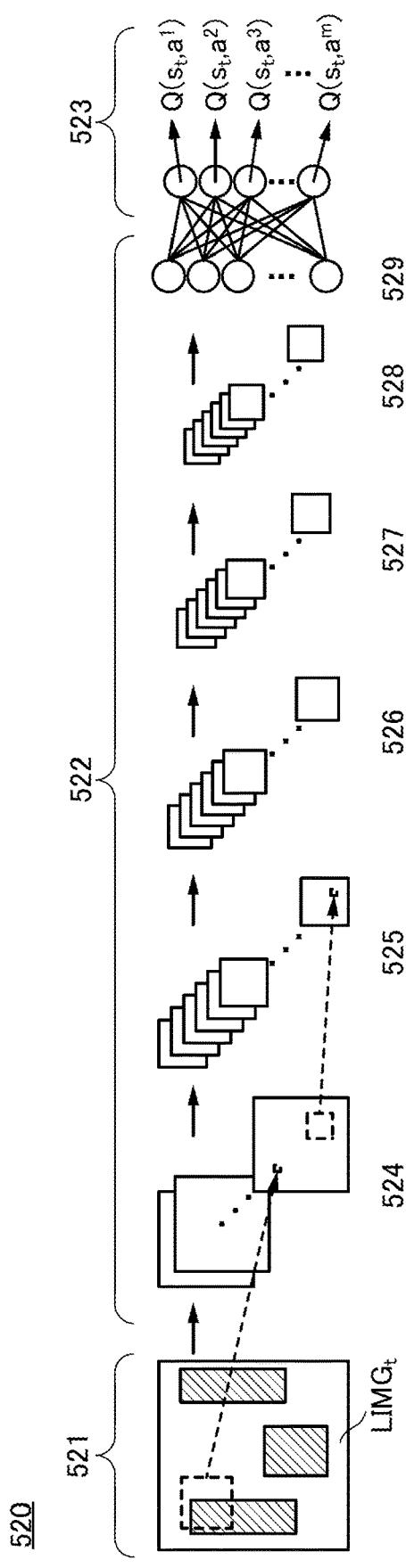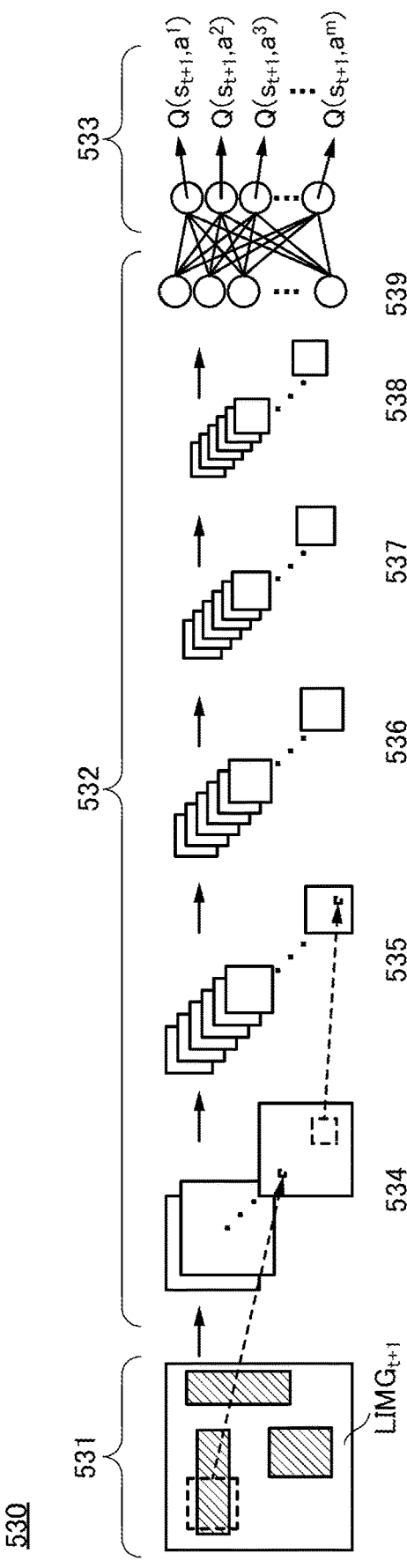

$a = x_1 w_1 + x_2 w_2 + b$

LAYOUT DESIGN SYSTEM AND LAYOUT DESIGN METHOD

CROSS REFERENCE TO RELATED APPLICATIONS

This application is a U.S. National Phase Application under 35 U.S.C. § 371 of International Application PCT/IB2018/054348, filed on Jun. 14, 2018, which is incorporated by reference, and which claims the benefit of a foreign priority application filed in Japan on Jun. 22, 2017, as Application No. 2017-122541.

TECHNICAL FIELD

One embodiment of the present invention relates to a layout design system and a layout design method.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

The semiconductor device in this specification and the like means all devices which can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device may each include a semiconductor device.

BACKGROUND ART

The scale of integrated circuits has been increased with progress of semiconductor techniques, and circuit designers are demanded to design a large-scale circuit in a short period. For design of integrated circuits, CAD tools which automatically perform layout design of digital circuits have been commercialized. In contrast, layout design of analog circuits or the like is manually performed by circuit designers, which sometimes requires a long operating time. In layout design, demands for circuit characteristics and a design rule need to be met and thus, high skills are expected of circuit designers.

Use of artificial intelligence is under consideration for various applications. Specifically, the use of the configuration of an artificial neural network is expected to enable obtaining computers with higher performance than conventional von Neumann computers, and in recent years, a variety of researches for building artificial neural networks in electronic circuits have been carried out.

For example, Patent Document 1 discloses an invention in which weight data necessary for computation with an artificial neural network is retained in a memory device including a transistor that contains an oxide semiconductor in its channel formation region.

REFERENCES

Patent Documents

[Patent Document 1] United States Patent Application Publication No. 2016/0343452

SUMMARY OF THE INVENTION

Problems to be Solved by the Invention

Circuit designers often conduct layout design operations manually in analog circuit design and the operations take time; thus, shortening the operating time for layout design is demanded. In the layout design of analog circuits, the layout area needs to be minimized for a reduction in manufacturing cost and an increase in operation speed and at the same time, a design rule needs to be satisfied in consideration of the parasitic capacitance of wirings and conductors and the like.

In view of the above, an object of one embodiment of the present invention is to provide a layout design system which can perform layout design in a short period of time. Another object of one embodiment of the present invention is to provide a layout design system which can perform layout design for a small layout area. Another object of one embodiment of the present invention is to provide a novel layout design system. Another object of one embodiment of the present invention is to provide a layout design method by which layout design can be performed in a short period of time. Another object of one embodiment of the present invention is to provide a layout design method by which layout design for a small layout area can be performed. Another object of one embodiment of the present invention is to provide a novel layout design method.

Note that the descriptions of these objects do not disturb the existence of other objects. One embodiment of the present invention does not need to achieve all the objects. Other objects can be derived from the descriptions of the specification, the drawings, and the claims.

Means for Solving the Problems

One embodiment of the present invention is a layout design system which includes a processing portion and in which a circuit diagram and layout design information are input to the processing portion, the processing portion has a function of generating layout data from the circuit diagram and the layout design information by performing Q learning, the processing portion has a function of outputting the layout data, the processing portion includes a first neural network, and the first neural network estimates an action value function in the Q learning.

One embodiment of the present invention is a layout design system which includes a terminal and a server and in which the terminal includes an input/output portion and a first communication portion, the server includes a processing portion and a second communication portion, a circuit diagram and layout design information are input to the input/output portion, the first communication portion has a function of supplying the circuit diagram and the layout design information to the server by one or both of wire communication and wireless communication, the processing portion has a function of generating layout data from the circuit diagram and the layout design information by performing Q learning, the processing portion has a function of supplying the layout data to the second communication portion, the second communication portion has a function of supplying the layout data to the terminal by one or both of wire communication and wireless communication, the processing portion includes a first neural network, and the first neural network estimates an action value function in the Q learning.

In the above-described layout design system, the first neural network is preferably a convolutional neural network.

In the above-described layout design system, it is preferable that the processing portion further include a second neural network, the second neural network estimate teacher data for the action value function, and a weight coefficient of the first neural network be updated in accordance with a loss function calculated from the teacher data.

In the above-described layout design system, the second neural network is preferably a convolutional neural network.

In the above-described layout design system, the processing portion may include a transistor. The transistor may include a metal oxide in a channel formation region. Alternatively, the transistor may include silicon in a channel formation region.

One embodiment of the present invention is a layout design method in which a circuit diagram and layout design information are input, Q learning is performed from the circuit diagram and the layout design information to generate layout data, an action value function is estimated using a first neural network in the Q learning, and the layout data is output.

In the layout design method, it is preferable that a second neural network estimate teacher data for the action value function and a weight coefficient of the first neural network be updated in accordance with a loss function calculated from the teacher data.

Effect of the Invention

One embodiment of the present invention makes it possible to provide a layout design system which can perform layout design in a short period of time. Alternatively, one embodiment of the present invention makes it possible to provide a layout design system which can perform layout design for a small layout area. Alternatively, one embodiment of the present invention makes it possible to provide a novel layout design system. Alternatively, one embodiment of the present invention makes it possible to provide a layout design method by which layout design can be performed in a short period of time. Alternatively, one embodiment of the present invention makes it possible to provide a layout design method by which layout design for a small layout area can be performed. Alternatively, one embodiment of the present invention makes it possible to provide a novel layout design method.

Note that the descriptions of the effects do not disturb the existence of other effects. One embodiment of the present invention does not need to have all the effects. Other effects can be derived from the descriptions of the specification, the drawings, and the claims.

BRIEF DESCRIPTION OF THE DRAWINGS

FIG. 7 A flowchart illustrating an example of layout design.

FIGS. 17A-17B Diagrams illustrating configuration examples of neural networks.

MODE FOR CARRYING OUT THE INVENTION

Figure 1:
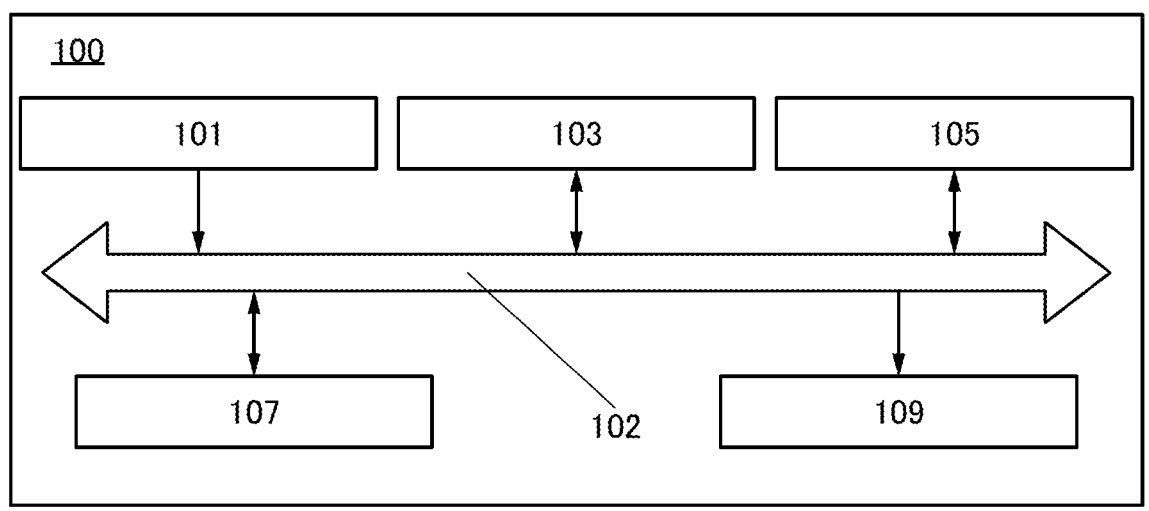
FIG. 1 A block diagram illustrating a layout design system.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a layout design system of one embodiment of the present invention is described with reference to FIG. 1 to FIG. 26.

A layout design system that is one embodiment of the present invention has a function of generating layout data on the basis of a circuit diagram and layout design information. The layout design system that is one embodiment of the present invention can be used for layout design of an integrated circuit.

In this specification and the like, layout design means generating layout data on the basis of a circuit diagram and layout design information. The circuit diagram is a diagram which expresses connection of active elements such as a transistor and a diode and passive elements such as a capacitor and a resistor with the use of figures and lines. The layout data is information on the shape and arrangement of a semiconductor layer, a conductor layer, or the like which is transferred to a mask (also referred to as a reticle). Note that in this specification and the like, an active element and a passive element are referred to as elements in some cases.

Layout design information includes a cell library, a design rule, and grid information. Details of layout design information will be described later.

The layout design system of one embodiment of the present invention includes a processing portion. To the processing portion, a circuit diagram and layout design information are input. The processing portion has a function of generating layout data from the circuit diagram and the layout design information. Note that the layout design system in this embodiment can be applied to a variety of kinds of layout design by changing the circuit diagram and the layout design information.

The use of the layout design system that is one embodiment of the present invention makes it possible to generate layout data which satisfies a circuit diagram generated through circuit design and a design rule and in which an integrated circuit has a small area.

The layout design system preferably uses an artificial intelligence (AI) for at least part of processing to generate layout data.

In particular, the layout design system preferably uses an artificial neural network (ANN: hereinafter just referred to as neural network) to generate output data. Note that in this specification and the like, an artificial neural network is just referred to as a neural network (NN) in some cases. The neural network is obtained with a circuit (hardware) or a program (software).

Reinforcement learning can be used for layout design. As reinforcement learning, TD learning (Temporal Difference Learning), Q learning, or the like can be employed, for example. It is particularly preferable that a learning algorithm using deep learning be employed in Q learning.

Q learning is a method in which the value of selection of an action $a_t$ by an agent at time t when the environment is in a state $s_t$ is learned. The agent means an agent that takes the action, and the environment means an object subject to the action. By the action $a_t$ by the agent, the environment makes a transition from a state $S_t$ to a state $S_{t+1}$ and the agent receives reward $r_{t+1}$. In Q learning, the action $a_t$ is learned such that the total amount of the obtained reward is peaked in the end. The value of taking the action $a_t$ in the state $s_t$ can be expressed as an action value function $Q(s_t,a_t)$. In this specification and the like, an action value function Q is referred to as a Q function and the value of the action value function $Q(s_t,a_t)$ is referred to as a Q value in some cases. For example, an update formula of the action value function $Q(s_t,a_t)$ can be expressed by Formula 1.

[Formula 1]

$$Q(s_t, a_t) \leftarrow Q(s_t, a_t) + \alpha \left[ r_{t+1} + \gamma \max_a Q(s_{t+1}, a) - Q(s_t, a_t) \right] \quad (1)$$

Here, α represents a learning rate (α is greater than 0 and less than or equal to 1) and γ represents a discount rate (γ is greater than or equal to 0 and less than or equal to 1). The learning rate α means which of the present value and the result obtained by an action is emphasized. As the learning rate α becomes closer to 1, the obtained result is more emphasized and a change in the value becomes larger. As the learning rate α becomes closer to 0, the present value is more emphasized and a change in the value becomes smaller. The discount rate γ means which of the present reward and a future reward is emphasized. As the discount rate γ becomes closer to 0, the present reward is more emphasized. As the discount rate γ becomes closer to 1, a future reward is more emphasized. For example, the learning rate α can be 0.10 and the discount rate γ can be 0.90.

Deep learning can be used for estimation of the above-described action value function $Q(s_t,a_t)$. A learning algorithm which uses deep learning for estimation of the action value function $Q(s_t,a_t)$ is referred to as Deep Q-Learning and a neural network used for Deep Q-Learning is referred to as Deep Q-Network (DQN) in some cases.

It is particularly preferable that the layout design system that is one embodiment of the present invention use Deep Q-Learning for layout design and the Deep Q-Network have a configuration of a convolutional neural network (CNN). Note that in this specification and the like, a Deep Q-Network is sometimes simply referred to as a neural network.

In general, in Q learning, data is stored in advance with a combination of the state $s_t$ and the action $a_t$ of the action value function $Q(s_t,a_t)$ which is in the form of a look-up table (LUT). However, there are a number of combinations of the state $s_t$ and the action $a_t$ and thus, a number of memories are necessary in some cases. In contrast, in the layout design system that is one embodiment of the present invention, the use of a neural network for estimation of the action value function $Q(s_t,a_t)$ can reduce the number of memories needed.

In this specification and the like, a neural network refers to a general model that is modeled on a biological neural network, determines the connection strength of neurons by learning, and has the capability of solving problems. A neural network includes an input layer, an output layer, and one or more intermediate layers (hidden layers) between the input layer and the output layer.

In the description of the neural network in this specification and the like, to determine a connection strength of neurons (also referred to as weight coefficient) from the existing information is referred to as "learning" in some cases.

Moreover, in this specification and the like, to draw a new conclusion from the neural network formed using the connection strength obtained by the learning is referred to as "inference" in some cases.

A neural network is executed by a huge number of product-sum operations. The use of one or both of a digital circuit and an analog circuit enables these operation processings. In the case where a digital circuit is used, a huge number of transistors are needed, resulting in inefficiency and high power consumption. Thus, the product-sum operations are preferably performed by an analog product-sum operation circuit (hereinafter referred to as APS (Analog Product-Sum circuit)). The APS preferably includes an analog memory. The APS stores a weight coefficient obtained by learning, in the analog memory, whereby the APS can perform the product-sum operations using analog data as it is. Consequently, the APS enables a neural network to be formed efficiently with a small number of transistors.

Note that in this specification and the like, an analog memory refers to a memory device that can store analog data. In addition, analog data refers to data having a resolution of three bits (eight levels) or more in this specification. Multilevel data is referred to as analog data in some cases.

As the analog memory, a multilevel flash memory, an ReRAM (Resistive Random Access Memory), an MRAM (Magnetoresistive Random Access Memory), or a memory using an OS transistor (referred to as OS memory) can be used.

Furthermore, in this specification and the like, a transistor using an oxide semiconductor or a metal oxide in its channel formation region is referred to as an Oxide Semiconductor transistor or an OS transistor. A channel formation region of the OS transistor preferably includes a metal oxide.

In this specification and the like, a metal oxide means an oxide of metal in a broad expression. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is to say, in the case where a metal oxide has at least one of an amplifying function, a rectifying function, and a switching function, the metal oxide can be called a metal oxide semiconductor, or OS for short.

The metal oxide included in the channel formation region preferably contains indium (In). In the case where the metal oxide included in the channel formation region is a metal oxide containing indium, the carrier mobility (electron mobility) of the OS transistor increases.

The metal oxide included in the channel formation region is preferably an oxide semiconductor containing an element M. The element M is preferably aluminum (Al), gallium (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that a plurality of the above-described elements may be combined as the element M in some cases. The element M is an element having high bonding energy with oxygen, for example. For example, the element M is an element whose bonding energy with oxygen is higher than that of indium. The metal oxide included in the channel formation region is preferably a metal oxide containing zinc (Zn). The metal oxide containing zinc is easily crystallized in some cases.

The metal oxide included in the channel formation region is not limited to a metal oxide containing indium. The semiconductor layer may be a metal oxide that does not contain indium and contains zinc, a metal oxide that contains gallium, or a metal oxide that contains tin, e.g., zinc tin oxide or gallium tin oxide.

1. Structure of Layout Design System

A structure of a layout design system 100 will be described. FIG. 1 shows a block diagram of the layout design system 100. The layout design system 100 includes at least a processing portion 103. The layout design system 100 shown in FIG. 1 further includes an input portion 101, a transmission path 102, a memory portion 105, a database 107, and an output portion 109.

[Input Portion 101]

Information is supplied to the input portion 101 from the outside of the layout design system 100. The information supplied to the input portion 101 is supplied to the processing portion 103, the memory portion 105, or the database 107 through the transmission path 102. Examples of the information supplied to the input portion 101 include a circuit diagram and layout design information.

[Transmission Path 102]

The transmission path 102 has a function of transmitting information. Transmission and reception of information between the input portion 101, the processing portion 103, the memory portion 105, the database 107, and the output portion 109 can be performed through the transmission path 102.

[Processing Portion 103]

The processing portion 103 has a function of performing layout design using information supplied from the input portion 101, the memory portion 105, the database 107, or the like to generate layout data. The processing portion 103 can supply layout data or the like to the memory portion 105, the database 107, the output portion 109, or the like.

A transistor whose channel formation region contains a metal oxide is preferably used in the processing portion 103. The transistor has an extremely low off-state current; therefore, with the use of the transistor as a switch for holding electric charge (data) which flows into a capacitor functioning as a memory element, a long data retention period can be ensured. When this feature is applied to at least one of a register and a cache memory included in the processing portion 103, the processing portion 103 can be operated only when needed, otherwise immediately preceding processing information is saved in the memory element, thereby making normally-off computing possible and reducing the power consumption of the layout design system.

The processing portion 103 includes, for example, an operation circuit, a central processing unit (CPU), or the like.

The processing portion 103 may include a microprocessor such as a DSP (Digital Signal Processor) or a GPU (Graphics Processing Unit). The microprocessor may be obtained with a PLD (Programmable Logic Device) such as an FPGA (Field Programmable Gate Array) or an FPAA (Field Programmable Analog Array). The processing portion 103 can interpret and execute instructions from various programs with the use of a processor to process various kinds of data and control programs. The programs to be executed by the processor are stored in at least one of a memory region of the processor and the memory portion 105.

The processing portion 103 may include a main memory. The main memory includes at least one of a volatile memory such as a RAM (Random Access Memory) and a nonvolatile memory such as a ROM (Read Only Memory).

For example, a DRAM (Dynamic Random Access Memory), an SRAM (Static Random Access Memory), or the like is used as the RAM, and a memory space is virtually assigned as a work space for the processing portion 103 and used. An operating system, an application program, a program module, program data, a look-up table, and the like which are stored in the memory portion 105 are loaded into the RAM for execution. The data, program, and program module which are loaded into the RAM are each directly accessed and operated by the processing portion 103.

In the ROM, a BIOS (Basic Input/Output System), firmware, and the like for which rewriting is not needed can be stored. As examples of the ROM, a mask ROM, an OTPROM (One Time Programmable Read Only Memory), an EPROM (Erasable Programmable Read Only Memory), and the like can be given. As examples of the EPROM, a UV-EPROM (Ultra-Violet Erasable Programmable Read Only Memory) which can erase stored data by ultraviolet irradiation, an EEPROM (Electrically Erasable Programmable Read Only Memory), a flash memory, and the like, can be given.

[Memory Portion 105]

The memory portion 105 has a function of storing a program to be executed by the processing portion 103. The memory portion 105 may have a function of storing layout data generated by the processing portion 103, information input to the input portion 101, and the like.

The memory portion 105 includes at least one of a volatile memory and a nonvolatile memory. For example, the memory portion 105 may include a volatile memory such as a DRAM or an SRAM. For example, the memory portion 105 may include a resistance change memory typified by a ReRAM (Resistive Random Access Memory) or the like, a magnetoresistive memory typified by a PRAM (Phase change Random Access Memory), a FeRAM (Ferroelectric Random Access Memory), or an MRAM (Magnetoresistive Random Access Memory), or a nonvolatile memory such as a flash memory. The memory portion 105 may include a storage media drive such as a hard disk drive (HDD) or a solid state drive (SSD).

[Database 107]

The database 107 has a function of storing a cell library and a design rule. The database 107 may have a function of storing layout data generated by the processing portion 103, information input to the input portion 101, and the like. Note that the memory portion 105 and the database 107 are not necessarily separated from each other. For example, the layout design system may include a storage unit that has both the function of the memory portion 105 and that of the database 107.

[Output Portion 109]

The output portion 109 has a function of supplying information to the outside of the layout design system 100. For example, the output portion 109 can supply layout data generated by the processing portion 103 to the outside.

2. Layout Design Method 1

A layout design method will be described.

Figure 2:
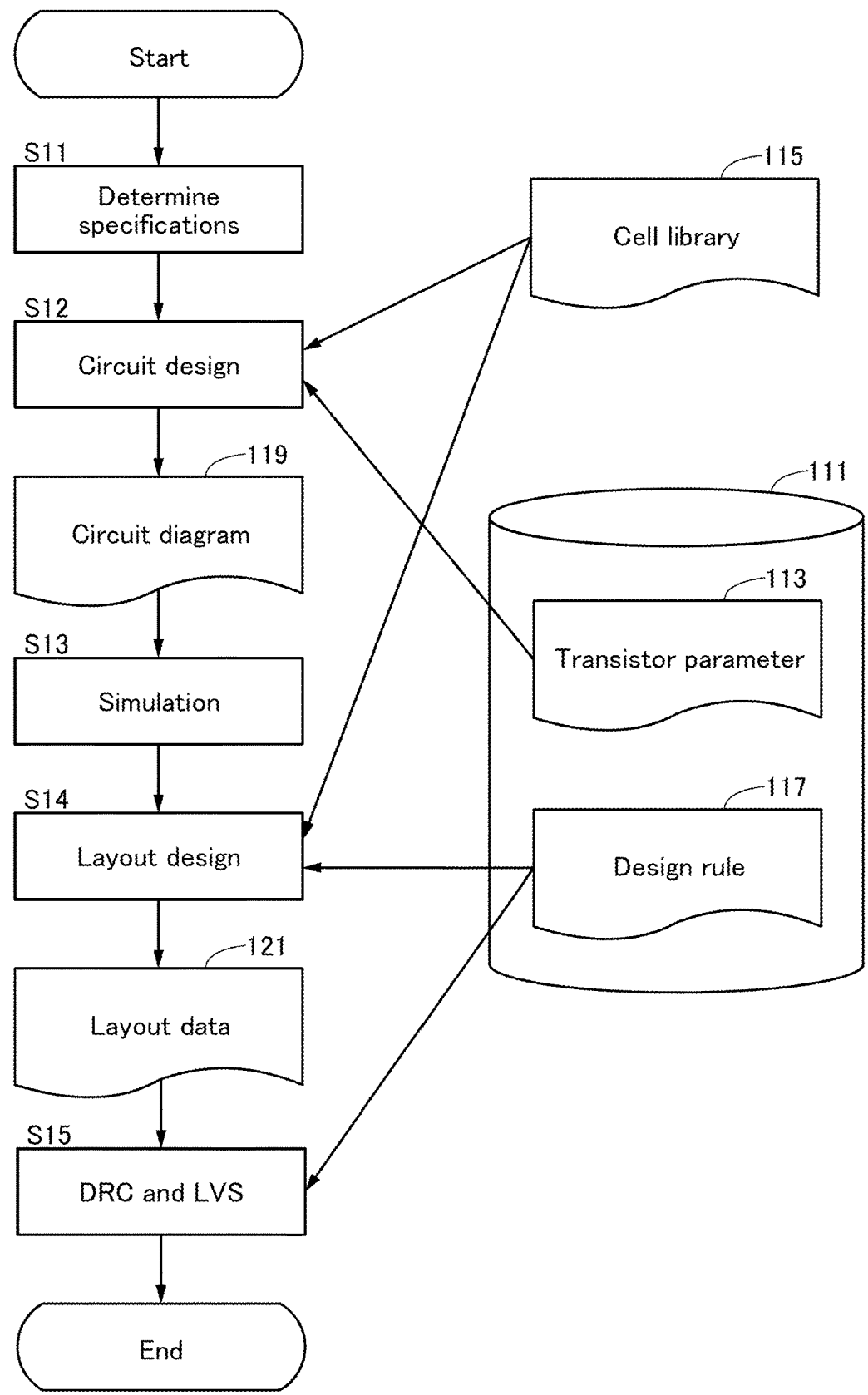
FIG. 2 A flowchart illustrating an example of development of an integrated circuit.

Preceding the description of the layout design method, first, a development flow of an integrated circuit is shown in FIG. 2. FIG. 2 shows a development flow of an analog circuit that is an example of an integrated circuit, which shows steps from a step of determining the specifications of the analog circuit to a step of completing generation of layout data.

Step S11 is a step of determining the specifications of a desired integrated circuit. The specifications of an integrated circuit include, for example, the characteristics of the integrated circuit, the size thereof, and the like.

Step S12 is a step of performing circuit design. In the circuit design, a circuit diagram 119 satisfying the specifications determined in Step S11 is generated with reference to mainly a cell library 115 and a transistor parameter 113 that is stored in process information 111. By varying the cell library 115 to be used, circuits with the same specifications that are in various modes can be obtained.

A cell library means a database for a basic cell. In analog circuit design, a basic cell sometime refers to individual elements such as a transistor and a capacitor. In digital circuit design, a basic cell sometimes refers to a logic gate such as an AND gate, a NAND gate, an OR gate, or a NOR gate that is a logical operation element.

A transistor parameter is information on an element used for an integrated circuit. Examples of a transistor parameter include the channel length, channel width, and mobility of a transistor.

Step S13 is a step of performing simulation. In Step S13, it is checked whether the circuit diagram 119 generated through the circuit design in Step S12 satisfies the specifications determined in Step S11 or not. When the specifications are not satisfied, the circuit design in Step S12 is performed again.

Step S14 is a step of performing layout design. In layout design, layout data 121 is generated with reference to mainly the circuit diagram 119 generated in Step S12, the cell library 115, and a design rule 117 stored in the process information 111. The layout design system 100 that is one embodiment of the present invention can be used for the layout design in Step S14.

A design rule, which is a restriction on layout design, refers to the minimum values or the like of the size of components (a semiconductor layer, a conductor layer, and the like) of each element and the interval therebetween. Examples of a design rule include the maximum values and the minimum values of the width of a wiring, the interval between a wiring and an adjacent wiring, the interval between a wiring and an adjacent element, the size of a contact hole, and the like.

Step S15 is a step of conducting DRC (Design Rule Check) and LVS (Layout versus Schematic). By DRC, it is checked whether the layout data 121 generated through the layout design in S14 satisfies the design rule 117 or not. In the case where the design rule is not satisfied, the layout design in Step S14 is performed again. By LVS, it is checked whether the layout data 121 generated through the layout design in Step S14 satisfies the connection relationship in the circuit diagram 119 generated in Step S12 or not. In the case where the connection relationship in the circuit diagram 119 is not satisfied, the layout design in Step S14 is performed again. Note that LVS is not necessarily conducted.

Although the example of an analog circuit is described with reference to FIG. 2, the layout design system 100 that is one embodiment of the present invention can also be used for a digital circuit or an analog/digital circuit. Furthermore, the layout design system 100 may be used for part of a circuit, instead of a whole circuit.

The description of the development flow of the integrated circuit has been completed.

An integrated circuit for which the layout design system 100 that is one embodiment of the present invention can be used will be described.

Figure 3:
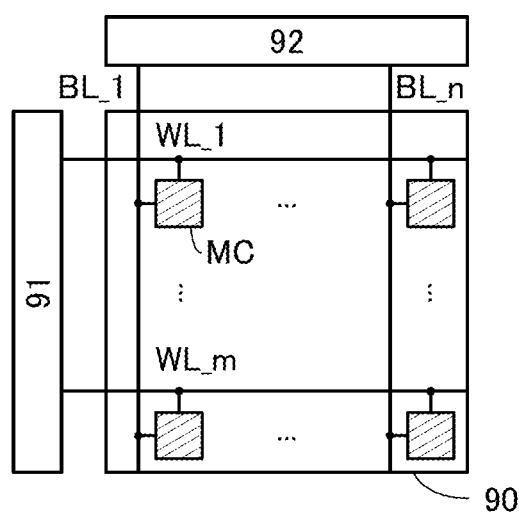
FIG. 3 A block diagram illustrating an example of an integrated circuit.

A configuration of a memory circuit, which is an example of an integrated circuit, will be described. FIG. 3 is a block diagram of the memory circuit. In the block diagram in FIG. 3, a memory cell array 90, a word line driver circuit 91, and a bit line driver circuit 92 are illustrated.

The memory cell array 90 includes memory cells MC arranged in a matrix of m rows and n columns (m and n are each a natural number). The memory cells MC are connected to word lines WL_1 to WL_m and bit lines BL_1 to BL_. In addition to the bit lines and the word lines, the memory cells MC may be connected to a source line for supplying a current, a wiring for applying voltage to a backgate of a transistor, a capacitor line for setting one electrode of a capacitor to a fixed potential, or the like.

The word line driver circuit 91 is a circuit that outputs a signal for selecting the memory cells MC in each row. Word lines for writing and word lines for reading may be provided separately as the word lines WL_1 to WL_m.

The bit line driver circuit 92 is a circuit for writing data into the memory cells MC in each column or for reading data from the memory cells MC. Bit lines for writing and bit lines for reading may be provided separately as the bit lines BL_1 to BL_n.

The memory cell MC includes a plurality of elements such as a transistor and a capacitor. The layout design system 100 that is one embodiment of the present invention can be used for layout design of the elements in the memory cell MC.

A layout design method using the layout design system 100 that is one embodiment of the present invention will be described.

Figure 4:
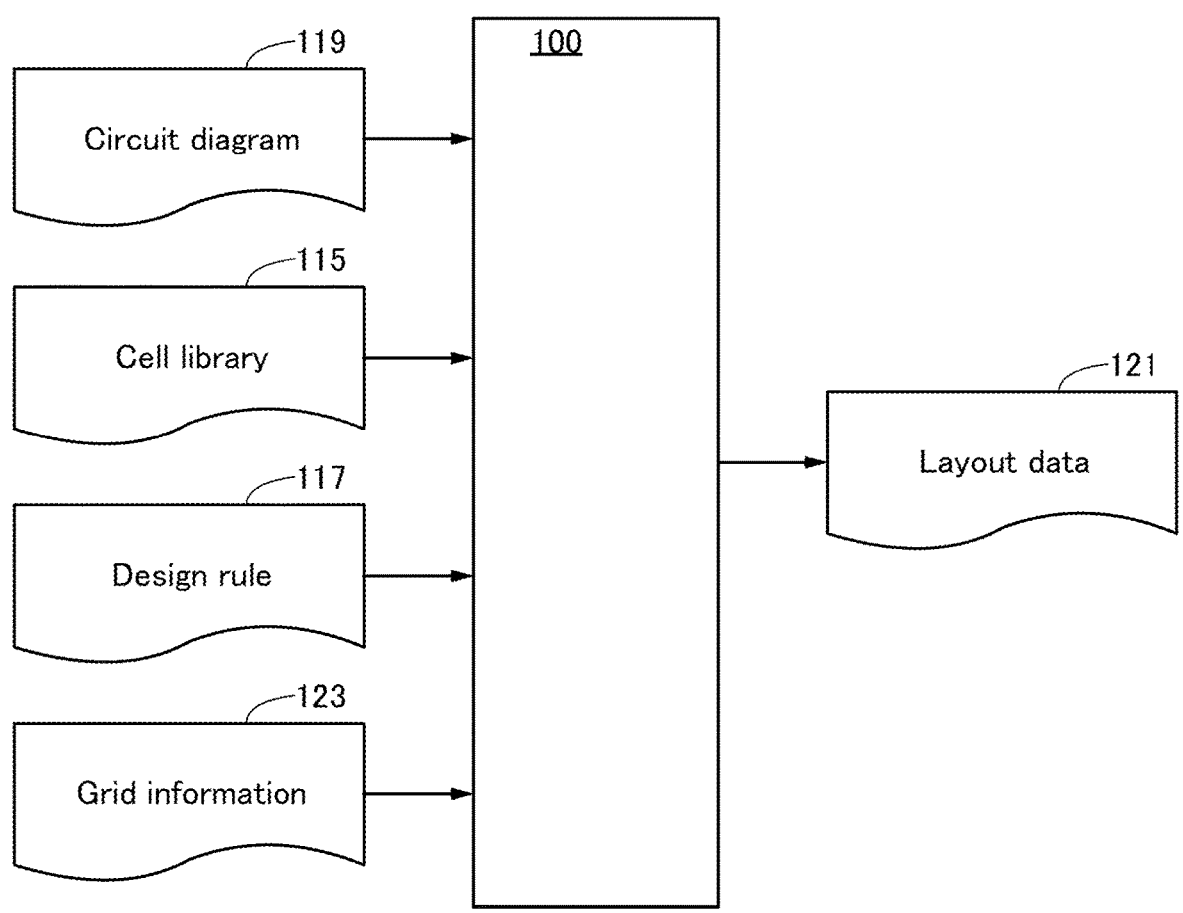
FIG. 4 A block diagram illustrating an example of a layout design system.

The layout design system 100 that is one embodiment of the present invention has a function of generating the layout data 121 on the basis of a circuit diagram and layout design information. Layout design information includes the cell library 115, the design rule 117, and grid information 123. FIG. 4 shows a block diagram illustrating an example of the layout design system 100. As illustrated in FIG. 4, the circuit diagram 119, the cell library 115, the design rule 117, and the grid information 123 are input to the layout design system 100 that is one embodiment of the present invention, and the layout data 121 is output therefrom.

Figure 5:
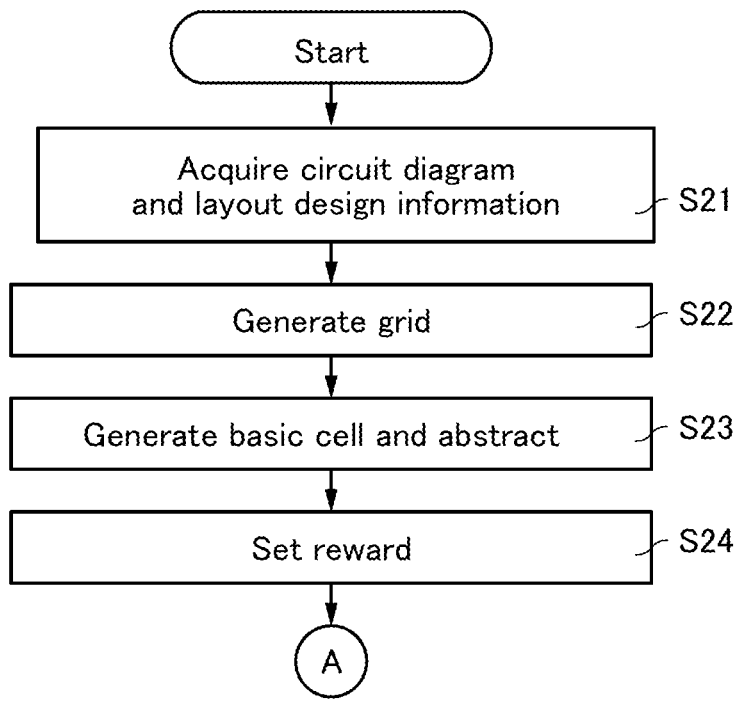
FIG. 5 A flowchart illustrating an example of layout design.
Figure 6:
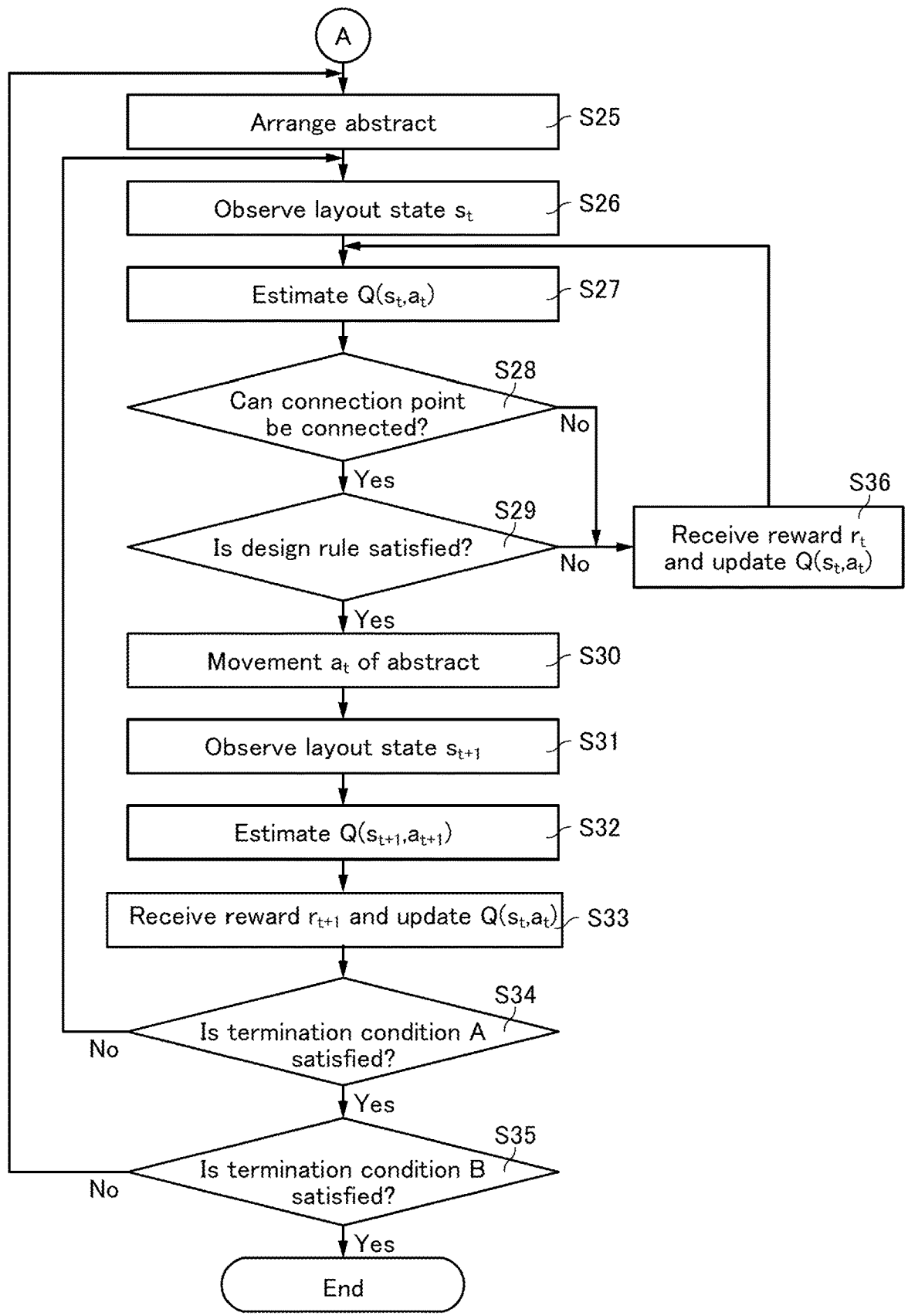
FIG. 6 A flowchart illustrating an example of layout design.

FIG. 5 and FIG. 6 show a flow of a layout design method using the layout design system 100. The flow shown in FIG. 5 and FIG. 6 corresponds to the layout design shown in Step S14 of FIG. 2, and is a flow for generating the layout data 121 on the basis of the circuit diagram 119 and layout design information. In one embodiment of the present invention, first, the arrangement of elements is determined and then, the path of a wiring between the elements is determined.

The use of the layout design system that is one embodiment of the present invention makes it possible to generate layout data which satisfies a circuit diagram generated through circuit design and a design rule and in which an integrated circuit has a small area.

Note that in this specification and the like, one flow from observation of a layout state in Step S26 through an update of the action value function $Q(s_t,a_t)$ in Step S33 and Step S36 is sometimes referred to as one episode. The number of updates of the action value function $Q(s_t,a_t)$ is sometimes referred to as the number of episodes.

[Step S21]

Step S21 is a step of acquiring a circuit diagram and layout design information.

As the circuit diagram, the circuit diagram 119 generated in Step S12 described above can be used. The circuit diagram 119 and layout information are input from the outside of the layout design system 100 to the input portion 101. Then, the circuit diagram 119 is supplied from the input portion 101 to the processing portion 103 through the transmission path 102. Alternatively, the circuit diagram 119 and the layout information may be stored in the memory portion 105 or the database 107 through the transmission path 102 and supplied from the memory portion 105 or the database 107 to the processing portion 103 through the transmission path 102.

As the circuit diagram, a netlist in which elements and connection relationships between the elements are described in a hardware description language (HDL) may be used. As the circuit diagram, a netlist in which elements and connection relationships between the elements are described by SPICE (Simulation Program with Integrated Circuit Emphasis) may be used.

Layout design information includes a cell library, a design rule, and grid information.

Grid information is the size of a grid frame and the value of a grid interval. A grid is a lattice formed by a plurality of straight lines periodically intersecting with each other. A grid frame refers to an outer edge of a region where a grid is provided, and is rectangular. A grid interval refers to an interval between the straight lines constituting a grid. The grid interval is preferably substantially the same as the minimum value of a wiring width defined by a design rule or smaller than the minimum value of the wiring width. The size of the grid frame is the grid interval multiplied by an integer. Note that in this specification and the like, a rectangle refers to a quadrangle whose four interior angles are all right angles and includes a square.

[Step S22]

Step S22 is a step of generating a grid by the processing portion 103.

Figure 8A:
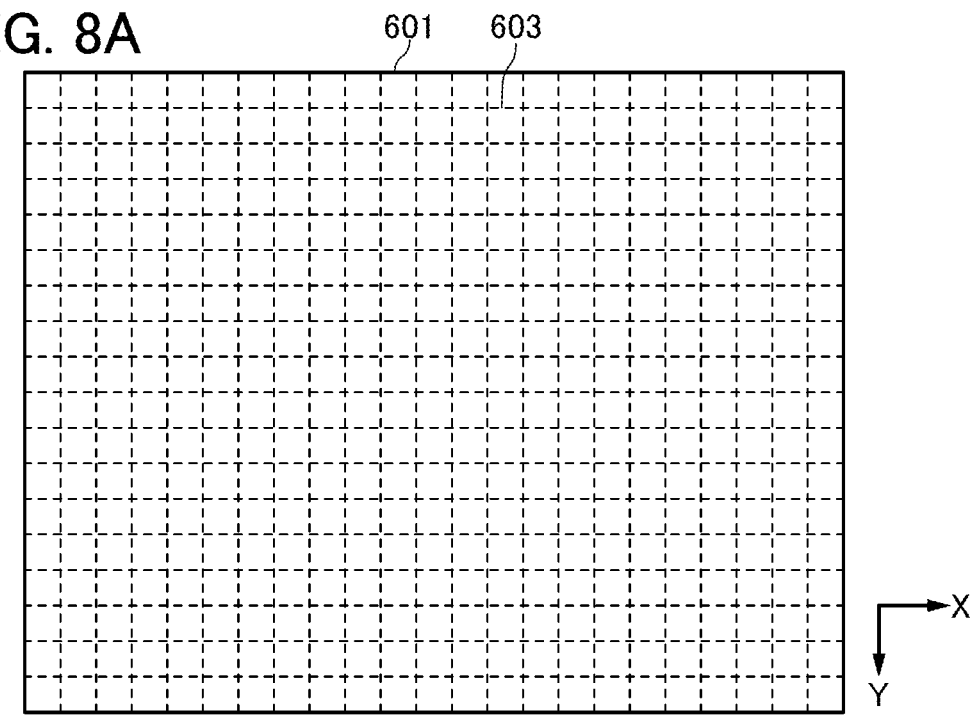
FIGS. 8A-8C Diagrams illustrating examples of a grid and a basic cell.

On the basis of the grid information acquired in Step S21, a grid frame 601 and a grid 603 are generated. Examples of the grid frame 601 and the grid 603 are shown in FIG. 8(A). This embodiment describes an example of using a square grid where the constituent straight lines are orthogonal to each other at regular intervals.

[Step S23]

Step S23 is a step of generating a basic cell and an abstract in the grid frame by the processing portion 103.

Figure 8B:
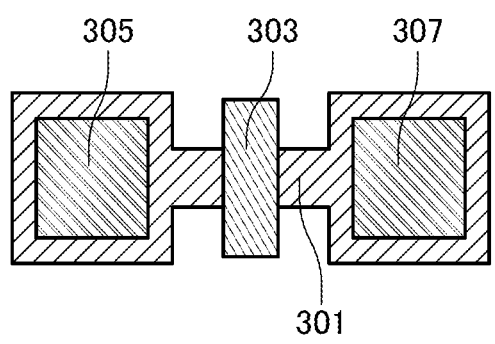
Figure 8C:
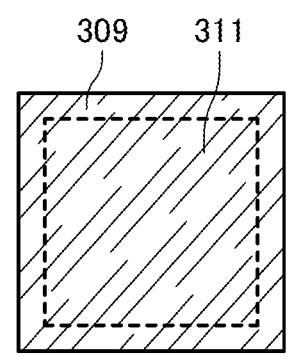

A basic cell is generated on the basis of the circuit diagram 119 acquired in Step S21. Examples of basic cells are shown in FIG. 8(B) and FIG. 8(C). FIG. 8(B) illustrates a transistor element including a semiconductor layer 301, a gate electrode 303, a source electrode 305, and a drain electrode 307. FIG. 8(C) illustrates a capacitor including an upper electrode 309 and a lower electrode 311 including a region that overlaps with the upper electrode 309. Note that FIG. 8(B) and FIG. 8(C) illustrate an example of using elements as basic cells, as an example of an analog circuit; however, one embodiment of the present invention is not limited to this example. In the case of an analog circuit, a logic gate or the like can be used as a basic cell.

An element is electrically connected to another element in some cases. An element is electrically connected to a word line, a bit line, or the like (hereinafter referred to as a signal line) in some cases. The connection relationship between an element and an element and that between an element and a signal line are based on the circuit diagram 119.

A region where an element or a signal line is electrically connected to another element or another signal line is referred to as a connection region. In the transistor element illustrated in FIG. 8(B), the three regions of the gate electrode 303, the source electrode 305, and the drain electrode 307 can be connection regions. In the capacitor illustrated in FIG. 8(C), the upper electrode 309 and the lower electrode 311 can be connection regions.

A position where an element or a signal line is electrically connected to another element or another signal line is referred to as a connection point. A connection point can be provided in the above-mentioned connection region. A connection point of an element or a signal line means a position where the element or the signal line can be electrically connected to a connection point of another element or another signal line. A connection point corresponds to the position of a contact hole in some cases.

Figure 9A:
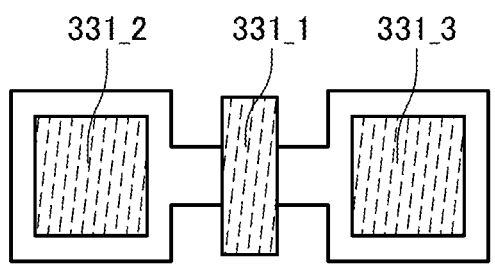
FIGS. 9A-9F Diagrams illustrating examples of a connection region and a connection point.
Figure 9B:
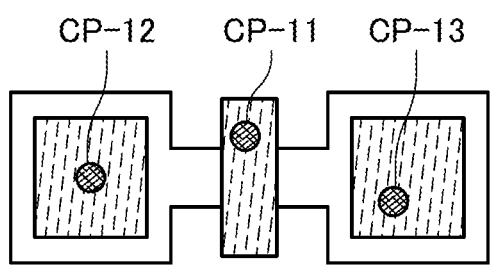

A connection region and a connection point are specifically described using the transistor element and the capacitor illustrated in FIG. 8(B) and FIG. 8(C). In the transistor element illustrated in FIG. 8(B), the regions of the gate electrode 303, the source electrode 305, and the drain electrode 307 are respectively a connection region 331_1 to a connection region 331_3. The connection region 331_1 to the connection region 331_3 are illustrated in FIG. 9(A). The connection region 331_1 to the connection region 331_3 can each be provided with a connection point. Examples of connection points provided in the connection region 331_1 to the connection region 331_3 are illustrated in FIG. 9(B). FIG. 9(B) illustrates a connection point CP_11 provided in the connection region 331_1, a connection point CP_12 provided in the connection region 331_2, and a connection point CP_13 provided in the connection region 331_3. Note that the connection point CP_11 to the connection point CP_13 illustrated in FIG. 9(B) are examples, and the positions of connection points are not limited thereto.

Figure 9C:
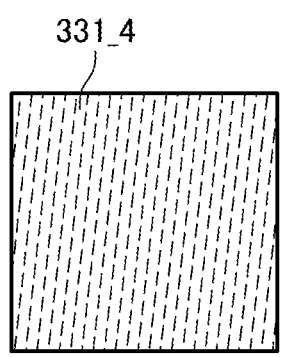
Figure 9D:
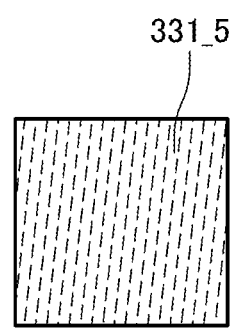
Figure 9E:
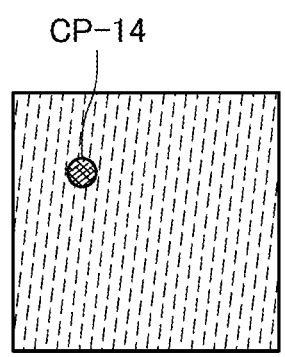
Figure 9F:
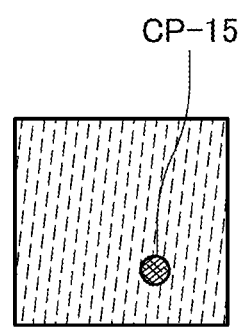

In the capacitor illustrated in FIG. 8(C), the regions of the upper electrode 309 and the lower electrode 311 are respectively a connection region 331_4 and a connection region 331_5. The connection region 331_4 and the connection region 331_5 are illustrated in FIG. 9(C) and FIG. 9(D), respectively. The connection region 331_4 and the connection region 331_5 can be respectively provided with a connection point CP_14 and a connection point CP_15. An example of the connection point CP_14 for the connection region 331_4 is illustrated in FIG. 9(E), and an example of the connection point CP_15 for the connection region 331_5 is illustrated in FIG. 9(F). Note that the connection point CP_14 and the connection point CP_15 illustrated in FIG. 9(E) and FIG. 9(F) are examples, and the positions of connection points are not limited thereto.

Figure 10A:
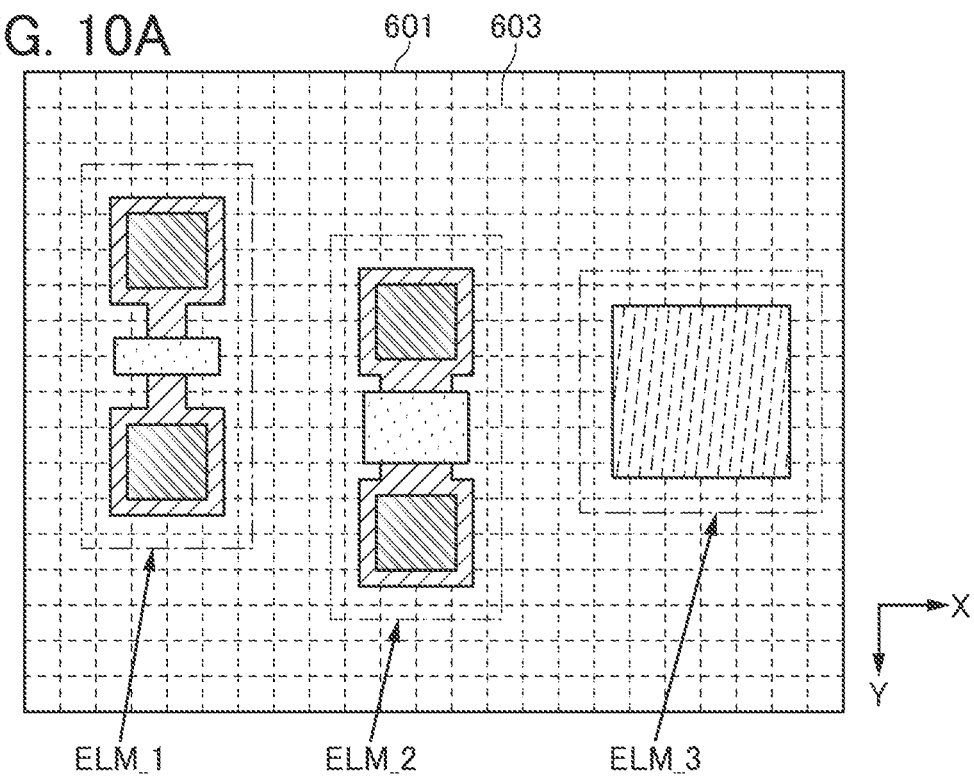
FIGS. 10A-10B Diagrams illustrating examples of a basic cell and an abstract.

FIG. 10(A) illustrates an example where basic cells are arranged in the grid frame 601. In FIG. 10(A), three basic cells of a basic cell ELM_1 to a basic cell ELM_3 are illustrated. The basic cell ELM_1 and the basic cell ELM_2 represent transistor elements and the basic cell ELM_3 represents a capacitor.

An abstract is generated on the basis of a basic cell. An abstract is the smallest rectangle that covers one basic cell entirely, and the outer edge of an abstract is generated only on the grid 603.

Figure 10B:
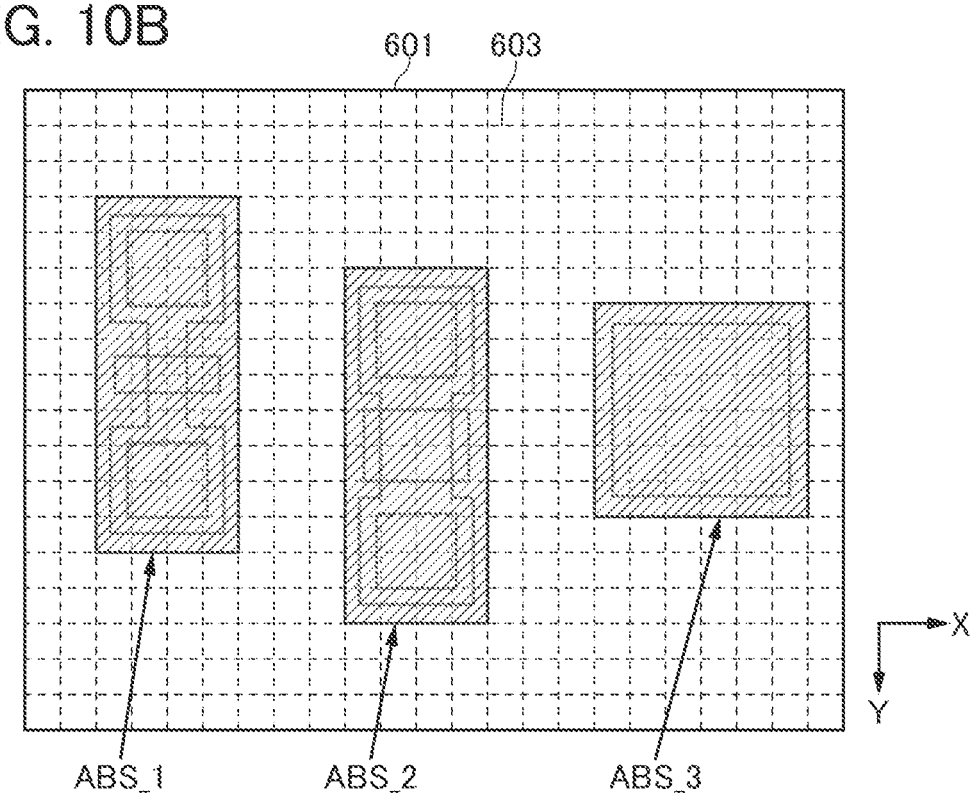

An abstract will be specifically described using the three basic cells of the basic cell ELM_1 to the basic cell ELM_3 illustrated in FIG. 10(A). FIG. 10(B) shows examples of the basic cell ELM_1 to the basic cell ELM_3 and an abstract ABS_1 to an abstract ABS_3 which respectively correspond to the basic cell ELM_1 to the basic cell ELM_3. The abstract ABS_1 is the smallest rectangle which covers the basic cell ELM_1 entirely and whose outer edge is on the grid 603. The abstract ABS_2 is the smallest rectangle which covers the basic cell ELM_2 entirely and whose outer edge is on the grid 603. The abstract ABS_3 is the smallest rectangle which covers the basic cell ELM_3 entirely and whose outer edge is on the grid 603. The hatchings of the abstract ABS_1 to the abstract ABS_3 are illustrated transparently in FIG. 10(B) so that the positional relationships between the basic cells and the abstracts are clearly shown.

Although FIG. 10(A) and FIG. 10(B) illustrate the three basic cells of ELM_1 to the basic cell ELM_3, one embodiment of the present invention is not limited thereto. k abstracts of the abstract ABS_1 to an abstract ABS_k are generated for the total number k of the basic cells included in a circuit diagram.

[Step S24]

Step S24 is a step of setting a reward $r_t$ by the processing portion 103.

Figure 11A:
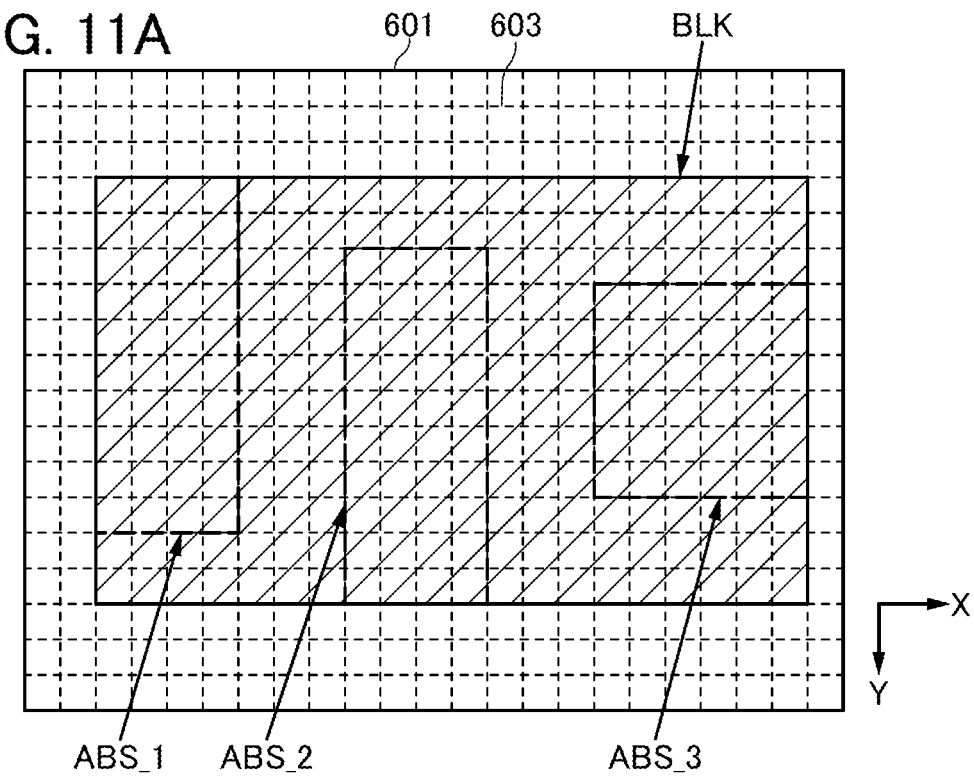
FIGS. 11A-11B Diagrams illustrating examples of a block and setting of reward.

The smallest rectangle that covers all the abstracts arranged in the grid frame 601 is a block, and the area of a block is calculated. The outer edge of a block is generated only on the grid 603. FIG. 11(A) illustrates the abstract ABS_1 to the abstract ABS_3 illustrated in FIG. 10(B) and an example of a block BLK corresponding to them.

Figure 11B:
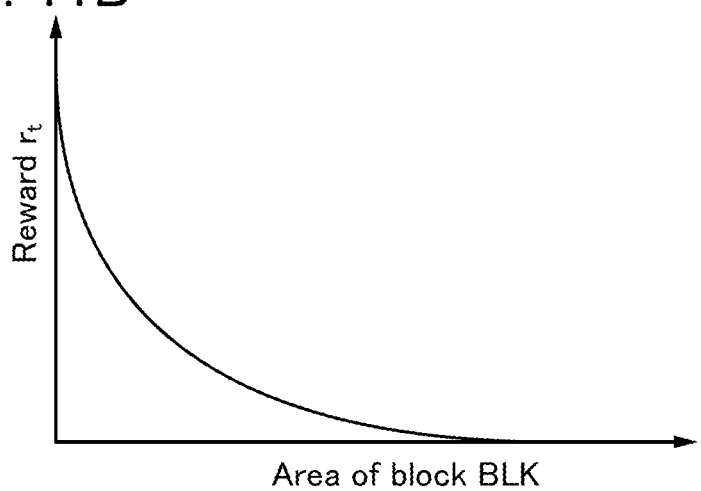

The reward $r_t$ is determined in accordance with the area of the block BLK. The relation between the area of the block BLK and the reward $r_t$ is shown in FIG. 11(B). In FIG. 11(B), the horizontal axis represents the area of the block BLK and the vertical axis represents the reward rt. As shown in FIG. 11(B), the reward $r_t$ is set to be higher as the area of the block BLK becomes smaller, and the reward $r_t$ is set to be smaller as the area of the block BLK becomes larger. Owing to setting such that the reward $r_t$ becomes higher as the area of the block BLK becomes smaller, a neural network can be made to learn to make the area of the block BLK small, which enables performing layout design for a small area. The value of the reward $r_t$ is preferably a finite value. When the value of the reward $r_t$ is a finite value, it is possible to prevent the layout design from not ending owing to the algorithm that does not converge. For example, the reward $r_t$ can be greater than or equal to −1 and less than or equal to 1. Although FIG. 11(B) shows an example where the reward $r_t$ decreases exponentially with respect to the area of the block BLK, one embodiment of the present invention is not limited thereto. The reward $r_t$ may decrease linearly with respect to the area of the block BLK. Although the setting of the reward $r_t$ in the described example are such that the reward $r_t$ becomes higher as the area of the block BLK becomes smaller, one embodiment of the present invention not limited thereto.

[Step S25]

Step S25 is a step of arranging an abstract in a layout frame randomly by the processing portion 103.

Figure 12A:
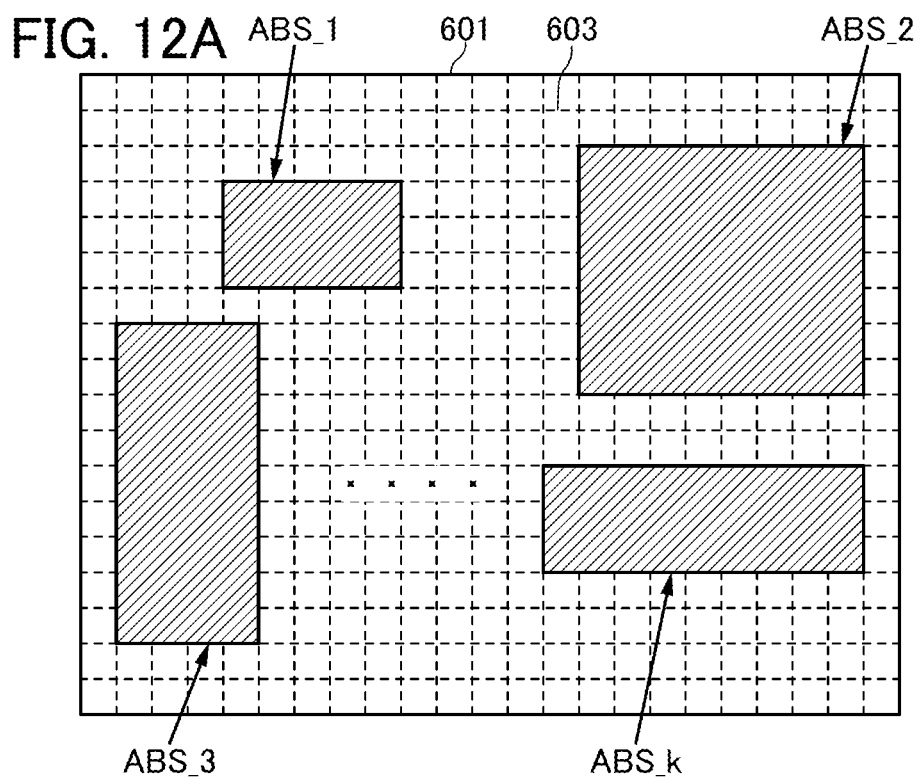
FIGS. 12A-12B Diagrams illustrating examples of an abstract and image data of a layout.

All the k abstracts generated in Step S22, i.e., the abstract ABS_1 to the abstract ABS_k, are randomly arranged in the grid frame 601. The state in which abstracts are randomly arranged can be referred to as the initial arrangement. An example of the initial arrangement of the abstract ABS_1 to the abstract ABS_k is illustrated in FIG. 12(A).

[Step S26]

Step S26 is a step of observing a layout state $s_t$ of the abstracts by the processing portion 103.

Figure 12B:
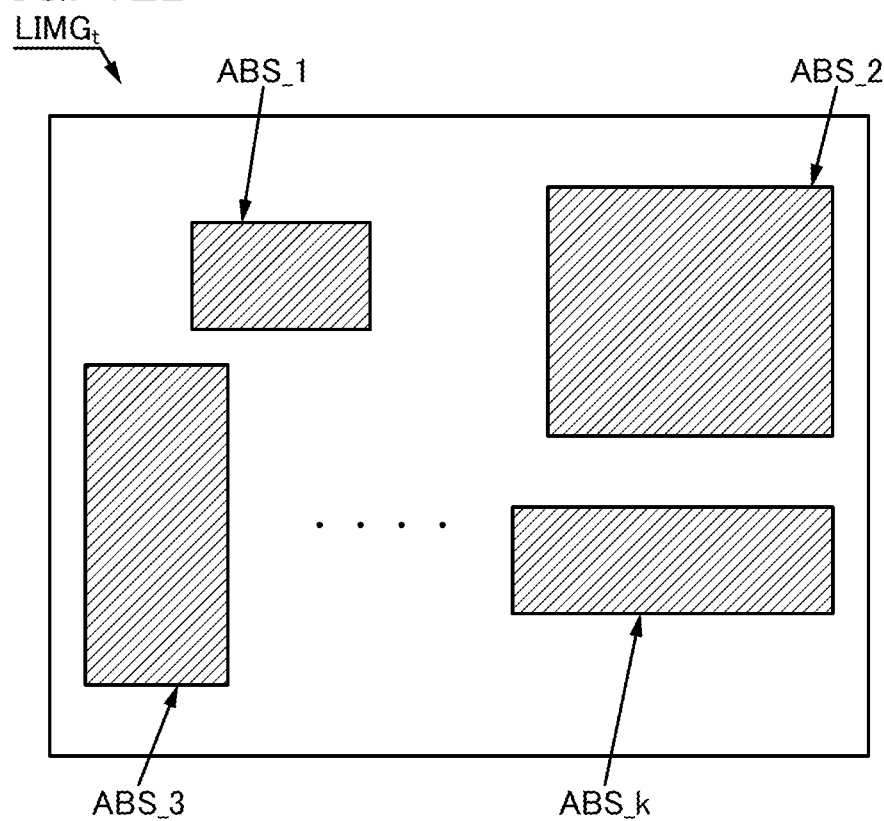

The layout state $s_t$ is stored in the memory portion 105 as image data $LIMG_t$ of a layout. FIG. 12(B) illustrates an example of the image data $LIMG_t$ of the layout that corresponds to the layout state $s_t$ of the abstract ABS_1 to the abstract ABS_k illustrated in FIG. 12(A). As illustrated in FIG. 12(B), the image data $LIMG_t$ includes only abstracts and does not necessarily include a grid. The image data $LIMG_t$ of the layout can be a grayscale, black and white, or color image.

In this embodiment, a grayscale image is used as the image data $LIMG_t$ of the layout. In FIG. 12(B), where the abstract ABS_1 to the abstract ABS_k are hatched, the hatching regions are grayscale regions.

Figure 13A:
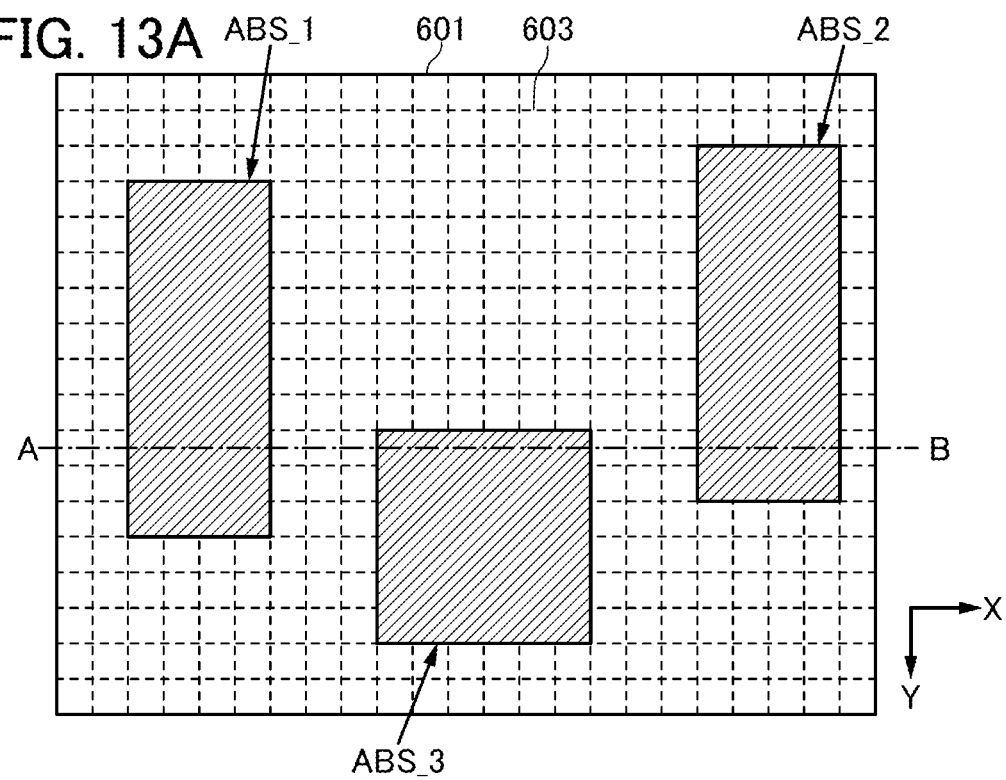
FIGS. 13A-13B Diagrams illustrating an example of a layout.
Figure 13B:
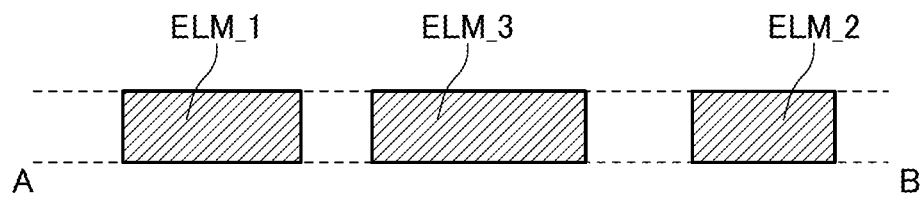
Figure 14:
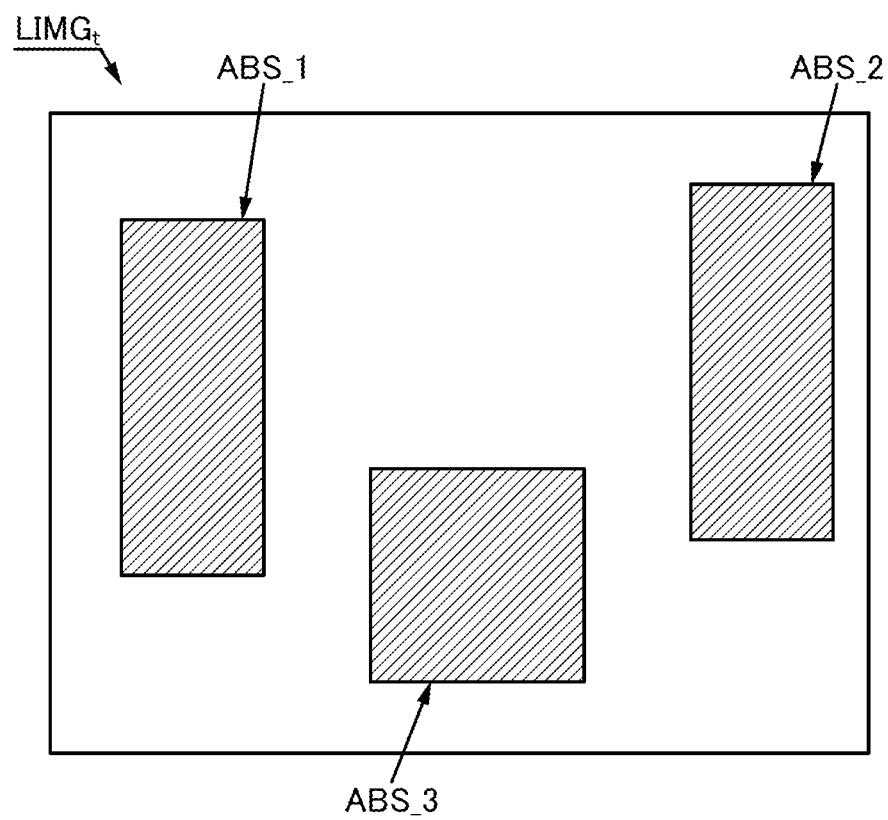
FIG. 14 A diagram illustrating an example of image data.

An example of a layout including three abstracts of the abstract ABS_1 to the abstract ABS_3 is illustrated in FIG. 13(A). FIG. 13(B) is a cross-sectional view taken along dashed-dotted line A-B in FIG. 13(A). The diagrams shown in FIG. 13(A) and FIG. 13(B) illustrate an example in which an element ELM_1 to an element ELM_3 that respectively correspond to the abstract ABS_1 to the abstract ABS_3 are formed in the same layer. Since the element ELM_1 to the element ELM_3 are formed in the same layer, it is preferable to employ a layout in which the abstract ABS_1 to the abstract ABS_3 do not overlap with each other. FIG. 14 illustrates the image data $LIMG_t$ corresponding to the layout illustrated in FIG. 13(A).

Figure 15A:
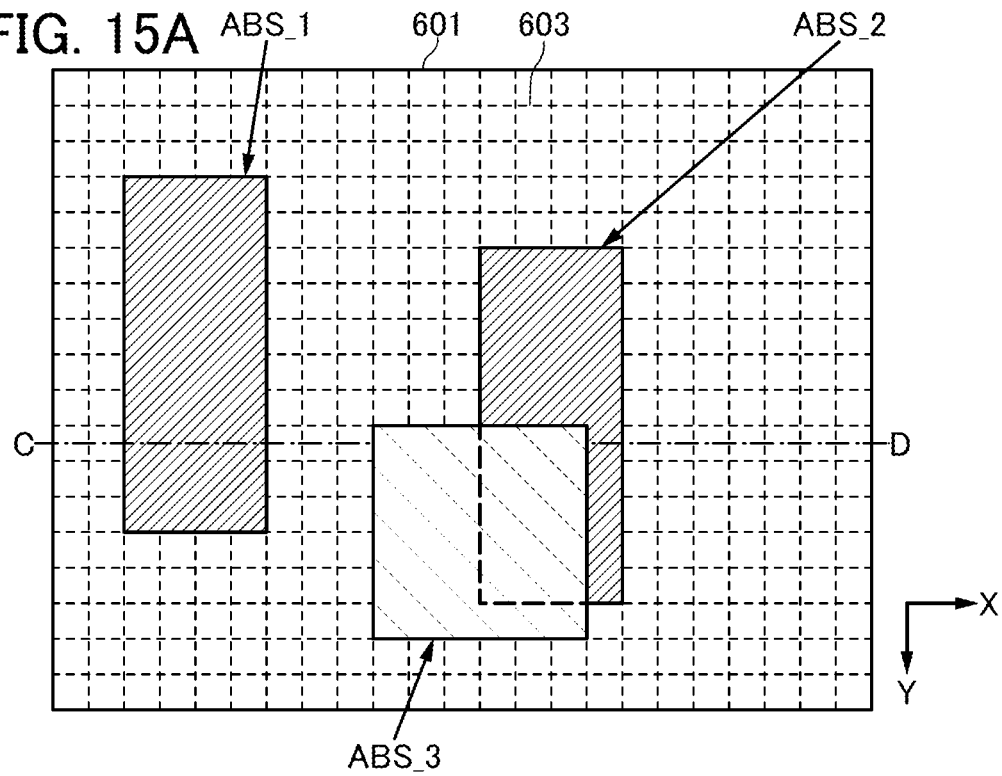
FIGS. 15A-15B Diagrams illustrating an example of a layout.
Figure 15B:
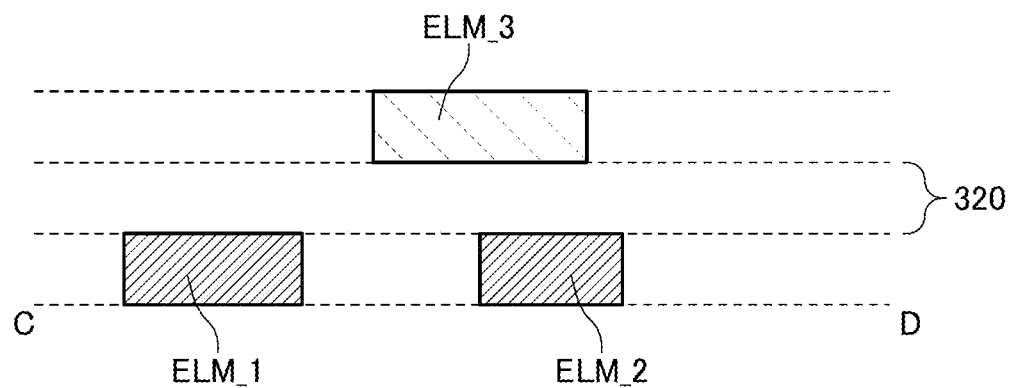

An example in which a plurality of elements are formed in the respective layers will be described. An example of a layout including three abstracts of the abstract ABS_1 to the abstract ABS_3 is illustrated in FIG. 15(A). FIG. 15(B) is a cross-sectional view taken along dashed-dotted line C-D in FIG. 15(A). The diagrams shown in FIG. 15(A) and FIG. 15(B) illustrate an example in which the element ELM_1 and the element ELM_2 that respectively correspond to the abstract ABS_1 and the abstract ABS_2 are formed in the same layer, and the element ELM_3 that corresponds to the abstract ABS_3 is formed in a layer different from the layer of the element ELM_1 and the element ELM_2. Since the element ELM_1 and the element ELM_2 are formed in a layer different from the layer of the element ELM_3, the abstract ABS_1 and the abstract ABS_2 can be arranged to overlap with the abstract ABS_3. Note that FIG. 15(B) illustrates a region 320 that includes a wiring electrically connecting one or more of the element ELM_1 and the element ELM_2 to the element ELM_3.

Figure 16A:
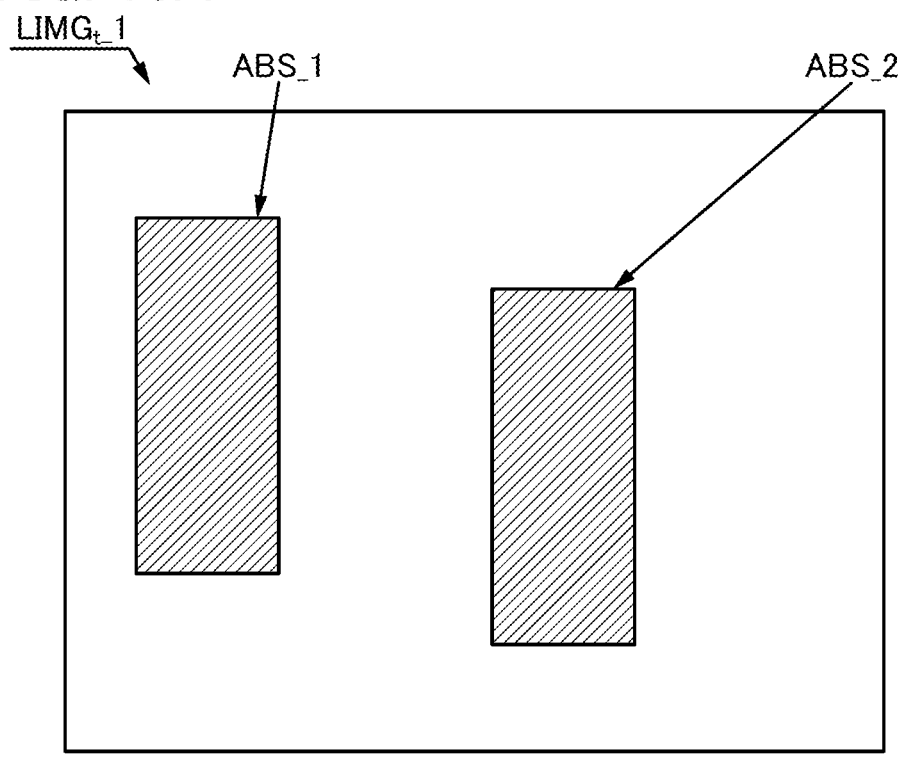
FIGS. 16A-16B Diagrams illustrating examples of image data.
Figure 16B:
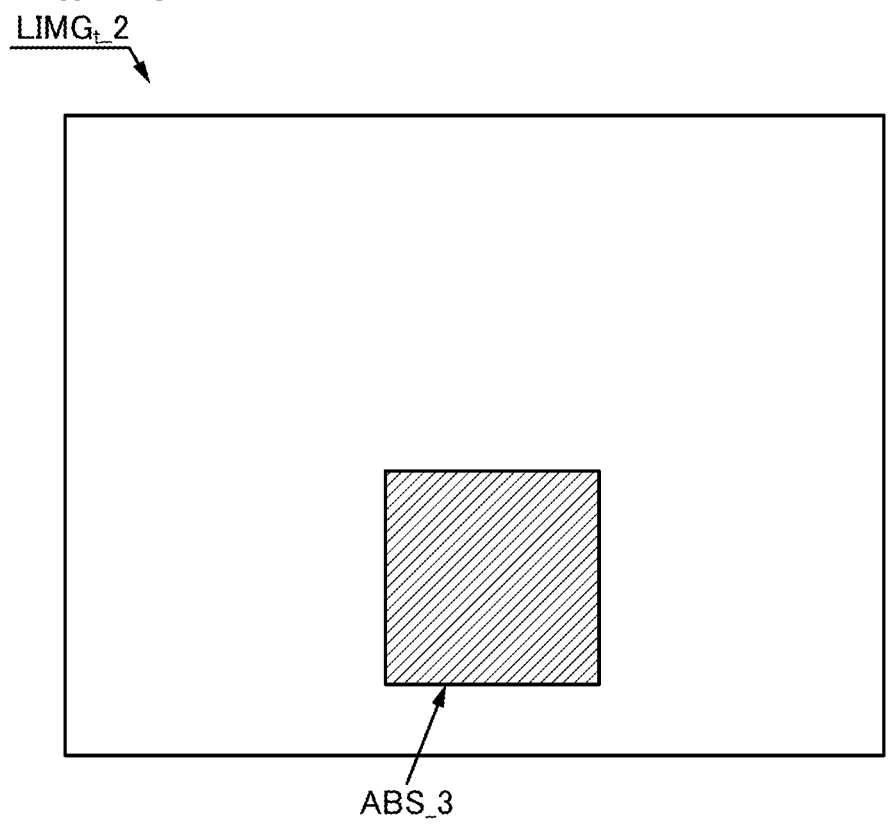

FIG. 16(A) and FIG. 16(B) illustrate image data that corresponds to the layout illustrated in FIG. 15(A). Image data $LIMG_t\_1$ illustrated in FIG. 16(A) includes the abstract ABS_1 and the abstract ABS_2 that are formed in the same layer. Image data $LIMG_t\_2$ illustrated in FIG. 16(B) includes the abstract ABS_3 that is formed in a layer different from the layer of the abstract ABS_1 and the abstract ABS_2. Abstracts formed in the same layer can be one piece of image data, and abstracts formed in different layers can be different pieces of image data. For example, when the number of the layers where abstracts are formed is p, there can be p pieces of image data of the image data $LIMG_t\_1$ to image data $LIMG_t\_p$.

[Step S27]

Step S27 is a step of estimating the action value function $Q(s_t,a_t)$ by the processing portion 103.

The processing portion 103 includes a first neural network 520 and estimates the action value function $Q(s_t,a_t)$ with the first neural network 520. In the first neural network 520, the input data is the image data $LIMG_t$ of the layout generated in Step S26 and the output data is the action value function $Q(s_t,a_t)$. For the first neural network 520, a convolutional neural network (CNN) configuration is preferably employed.

FIG. 17(A) illustrates the configuration of the first neural network 520. FIG. 17(A) illustrates an example where a convolutional neural network (CNN) configuration is used for a neural network. The first neural network 520 illustrated in FIG. 17(A) includes an input layer 521, an intermediate layer 522, and an output layer 523. The image data $LIMG_t$ of the layout, which is the input data, is shown in the input layer 521; an action value function $Q(s_t,a^1)$ to an action value function $Q(s_t,a^m)$ are shown as output data. In the layout state $s_t$, there are m possible movements of a movement $a^1$ to a movement $a^m$, and action value functions corresponding to the movements are denoted by $Q(s_t,a^1)$ to the action value function $Q(s_t,a^m)$. The movement a with the highest Q value among the action value function $Q(s_t,a^1)$ to the action value function $Q(s_t,a^m)$ can be selected as the next abstract movement.

In FIG. 17(A), the intermediate layer 522 includes a convolution layer 524, a pooling layer 525, a convolution layer 526, a pooling layer 527, a convolution layer 528, and a fully-connected layer 529. Note that the configuration of the intermediate layer 522 is an example; the number of the intermediate layers 522 is one or more and the number and configuration of layers are not particularly limited. For example, a configuration in which pooling processing and convolution operation processing are conducted with a larger number of layers, or a configuration in which pooling processing and convolution operation processing are conducted through operation processings such as padding and stride may be employed. Note that a filter is not shown in FIG. 17(A).

In the case where the image data $LIMG_t$ of the layout acquired in Step S25 is a color image, the color image may be converted into a grayscale image and the grayscale image may be used as the input data. The conversion into grayscale can adopt an NTSC weighted average method or the like. In the case where a color (multichannel) image is used as the input data, a plurality of kinds of filters corresponding to the channels may be used in the convolution layers of the first neural network 520. In the case where a plurality of pieces of the image data $LIMG_t$ are the input data, different filters may be used for the pieces of the image data $LIMG_t$.

Figure 18A:
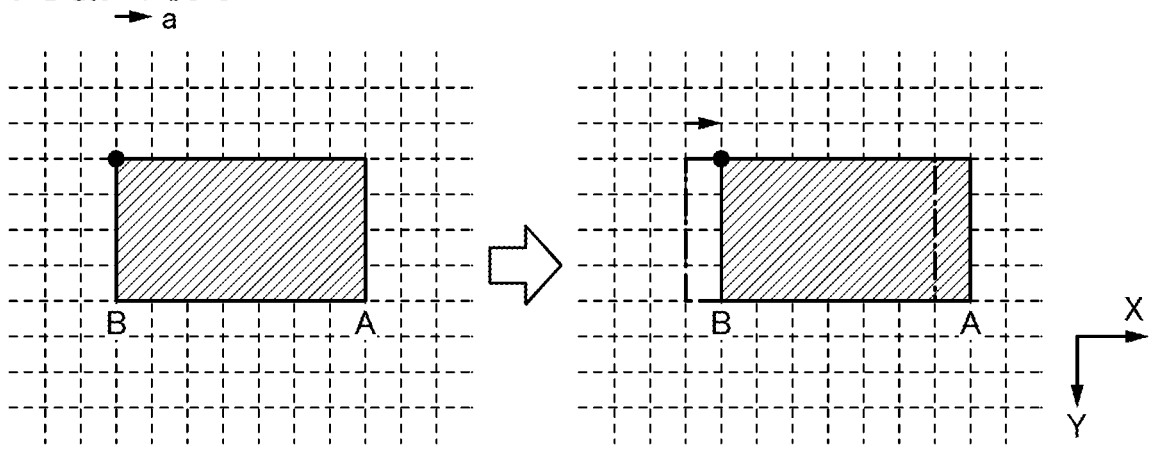
FIGS. 18A-18C Diagrams illustrating examples of a movement of an abstract.
Figure 18B:
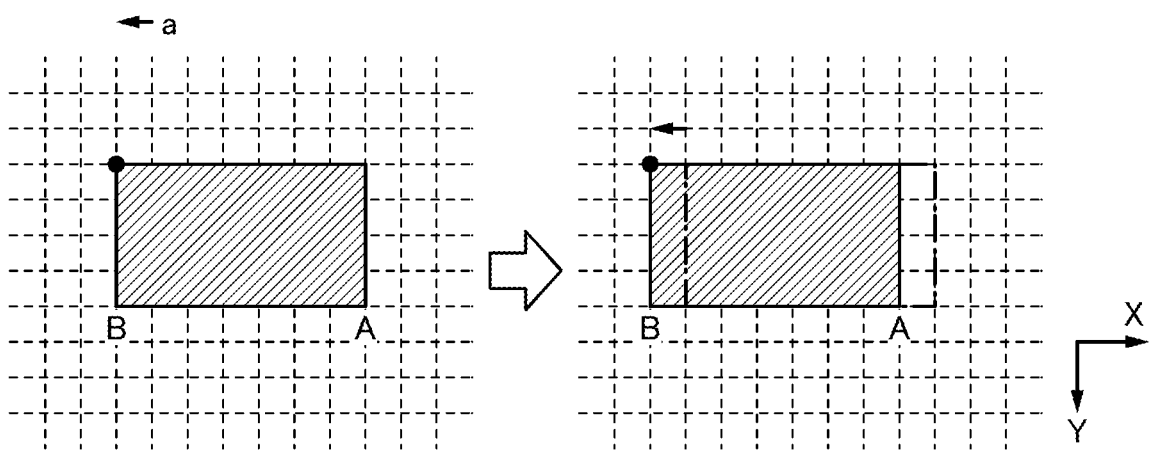
Figure 18C:
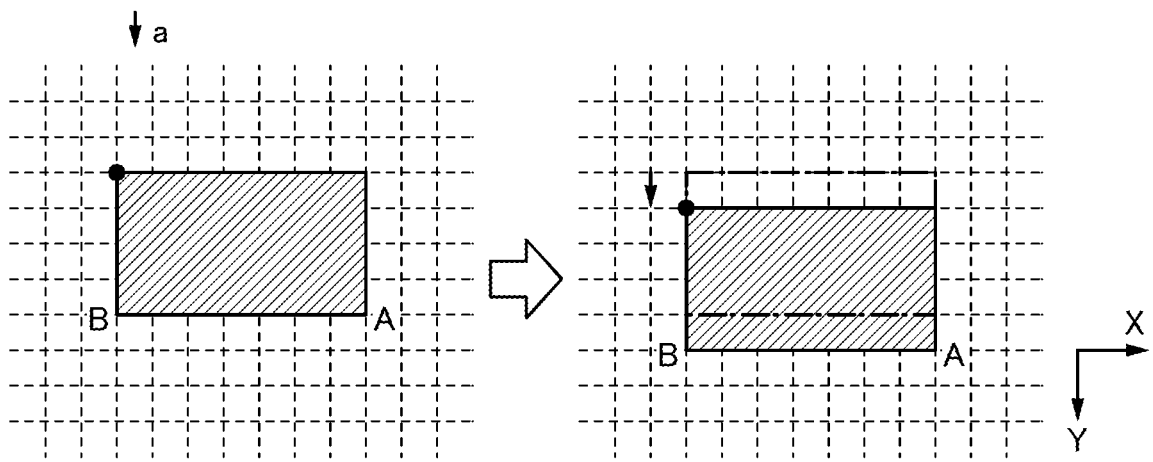
Figure 19A:
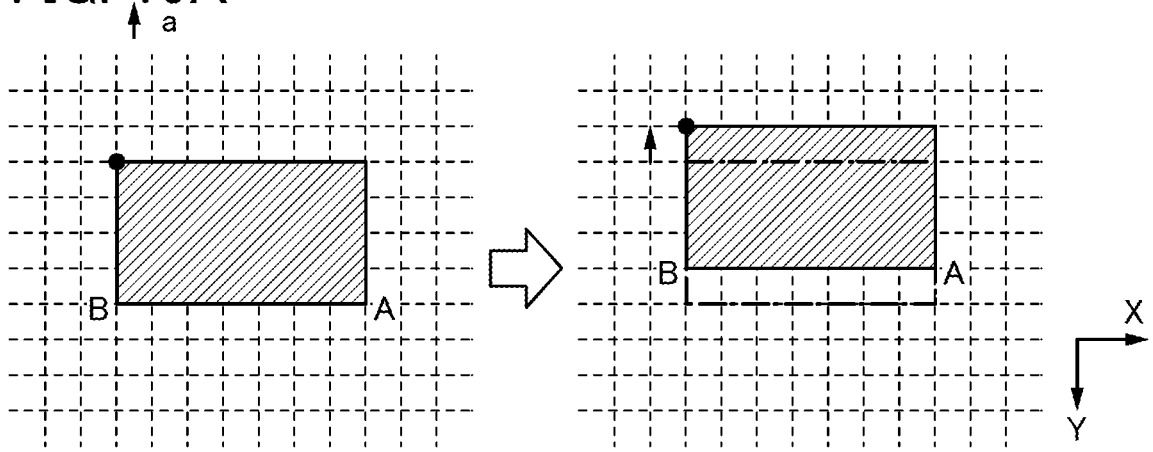
FIGS. 19A-19C Diagrams illustrating examples of a movement of an abstract.
Figure 19B:
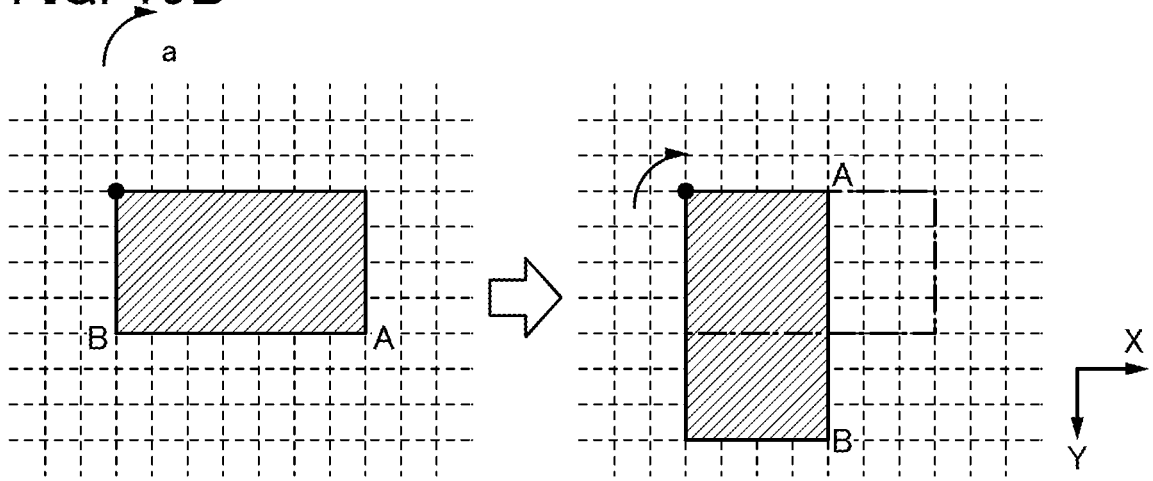
Figure 19C:
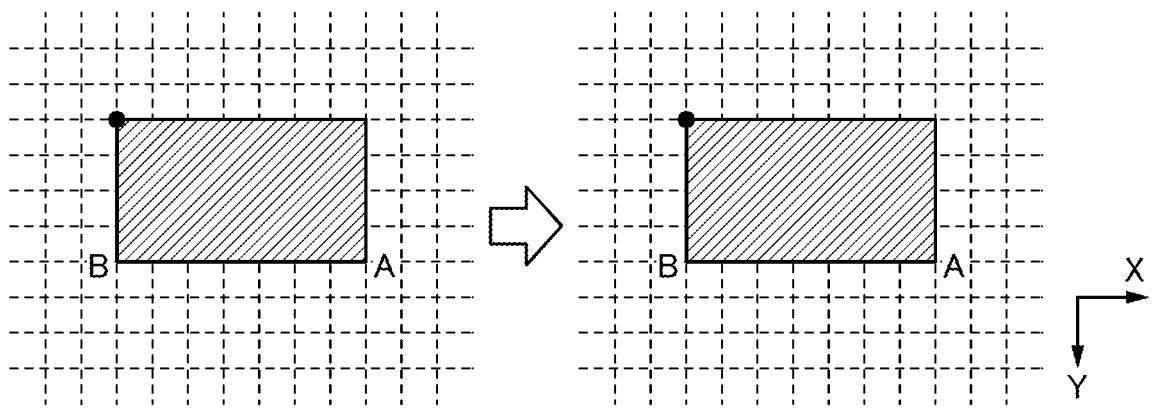

A possible movement at of an abstract will be described. The movement $a_t$ of one abstract ABS can be of six kinds: moving in the X-axis direction by +1; moving in the X-axis direction by −1; moving in the Y-axis direction by +1; moving in the Y-axis direction by −1; rotating 90° in place; and not moving. FIG. 18(A) illustrates an example in which the abstract ABS moves in the X-axis direction by +1. FIG. 18(B) illustrates an example in which the abstract ABS moves in the X-axis direction by −1. FIG. 18(C) illustrates an example in which the abstract ABS moves in the Y-axis direction by +1. FIG. 19(A) illustrates an example in which the abstract ABS moves in the Y-axis direction by −1. FIG. 19(B) illustrates an example in which the abstract ABS rotates 90° in place. FIG. 19(C) illustrates an example in which the abstract ABS does not move. The grid interval is one unit in the movement in each of the X-axis direction and the Y-axis direction. Out of the four vertices of the abstract ABS, the vertex having the smallest X coordinate and the smallest Y coordinate is the reference point. In FIG. 18(A) to FIG. 18(C) and FIG. 19(A) and FIG. 19(C), the reference points are denoted by black dots.

Note that in this embodiment, by the movement in FIG. 19(B), which is 90° rotation in place, the abstract is rotated 90° to the left (counterclockwise) in such a manner that the coordinate of the reference point before the rotation and that of the reference point after the rotation is the same. Since the grid whose constituent straight lines are orthogonal to each other is used in this embodiment, the rotation of the abstract was 90°. Note that in the case where the constituent straight lines of the grid are not orthogonal to each other, the angle formed by the straight lines can be the rotation angle of the abstract. For example, in the case of using a grid whose constituent straight lines intersect with each other at 30°, two types of rotations of 30° and 150° may be used as possible actions of the abstract.

Examples of output data in the case where there are k abstracts are listed in Table 1. Possible actions are five kinds of possible actions of moving in the X-axis direction by +1, moving in the X-axis direction by −1, moving in the Y-axis direction by +1, moving in the Y-axis direction by −1, and 90° rotation in place of each of the abstract ABS_1 to the abstract ABS_k, as well as one kind of action of no abstract moving. As shown in Table 1, there are (5 k+1) possible movements of the abstract ABS_1 to the abstract ABS_k, which are a movement $a^1$ to a movement $a^{5k+1}$, and there can be (5 k+1) pieces of output data, which are the action value function $Q(s_t, a^1)$ to the action value function $Q(s_t, a^{5k+1})$. The movement a with the highest Q value among the action value function $Q(s_t, a^1)$ to the action value function $Q(s_t, a^{5k+1})$ can be selected as the next abstract movement.

For example, in the case where there are three abstracts of the abstract ABS_1 to the abstract ABS_3, there can be 16 pieces of output data, which are the action value function $Q(s_t, a^1)$ to the action value function $Q(s_t, a^{16})$. The movement a with the highest Q value among the action value function $Q(s_t, a^1)$ to the action value function $Q(s_t, a^{16})$ can be selected as the next abstract movement.

TABLE 1

| | Movement a | | |
|---|---|---|---|
| Output data | Movement a | Abstract to be moved | Details of movement |
| $Q(s_t, a^1)$ | $a^1$ | ABS_1 | +1 in X-axis direction |
| $Q(s_t, a^2)$ | $a^2$ | | −1 in X-axis direction |
| $Q(s_t, a^3)$ | $a^3$ | | +1 in Y-axis direction |
| $Q(s_t, a^4)$ | $a^4$ | | −1 in Y-axis direction |
| $Q(s_t, a^5)$ | $a^5$ | | 90° rotation |
| $Q(s_t, a^6)$ | $a^6$ | ABS_2 | +1 in X-axis direction |
| $Q(s_t, a^7)$ | $a^7$ | | −1 in X-axis direction |
| $Q(s_t, a^8)$ | $a^8$ | | +1 in Y-axis direction |
| $Q(s_t, a^9)$ | $a^9$ | | −1 in Y-axis direction |
| $Q(s_t, a^{10})$ | $a^{10}$ | | 90° rotation |
| . | . | . | . |
| . | . | . | . |
| . | . | . | . |
| $Q(s_t, a^{5k-4})$ | $a^{5k-4}$ | ABS_k | +1 in X-axis direction |
| $Q(s_t, a^{5k-3})$ | $a^{5k-3}$ | | −1 in X-axis direction |
| $Q(s_t, a^{5k-2})$ | $a^{5k-2}$ | | +1 in Y-axis direction |
| $Q(s_t, a^{5k-1})$ | $a^{5k-1}$ | | −1 in Y-axis direction |
| $Q(s_t, a^{5k})$ | $a^{5k}$ | | 90° rotation |
| $Q(s_t, a^{5k+1})$ | $a^{5k+1}$ | — | No movement |

An ε-greedy method may be used for the selection of the movement a. In an ε-greedy method, the movement a with the highest Q value is selected with a probability of (1−ε) and a movement a is selected randomly with a probability of ε (ε is larger than 0 and less than or equal to 1). For example, the movement a with the highest Q value can be selected with a probability of 0.95 (95%), and a movement a can be selected randomly with a probability of 0.05 (5%). When an δ-greedy method is employed, selected actions a can be prevented from being uneven, and a more optimal action value function Q can be learned. Note that ε may be initially large in learning and may become smaller as the learning proceeds. When ε is set large initially in learning, the influence of the initial arrangement of abstracts can be reduced; when c becomes smaller as the learning proceeds, the learning can proceed efficiently.

[Step S28]

Step S28 is a step of determining whether connection points can be connected or not, by the processing portion 103.

An object subject to the determination is the layout in the case of performing the movement at selected in Step S27. Determined is whether or not the connection points of the basic cells ELM which correspond to the abstracts ABS can be connected to satisfy the connection relationship in the circuit diagram 119 in a layout of the abstracts ABS in a moved state.

Figure 20A:
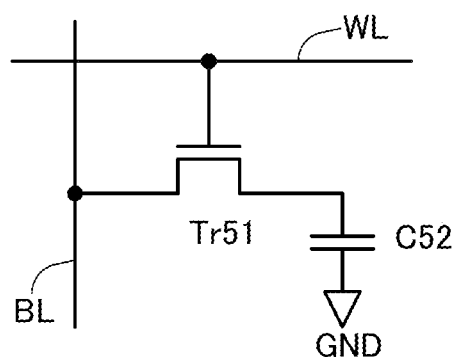
FIGS. 20A-20B A circuit diagram and a diagram illustrating an example of an abstract.
Figure 20B:
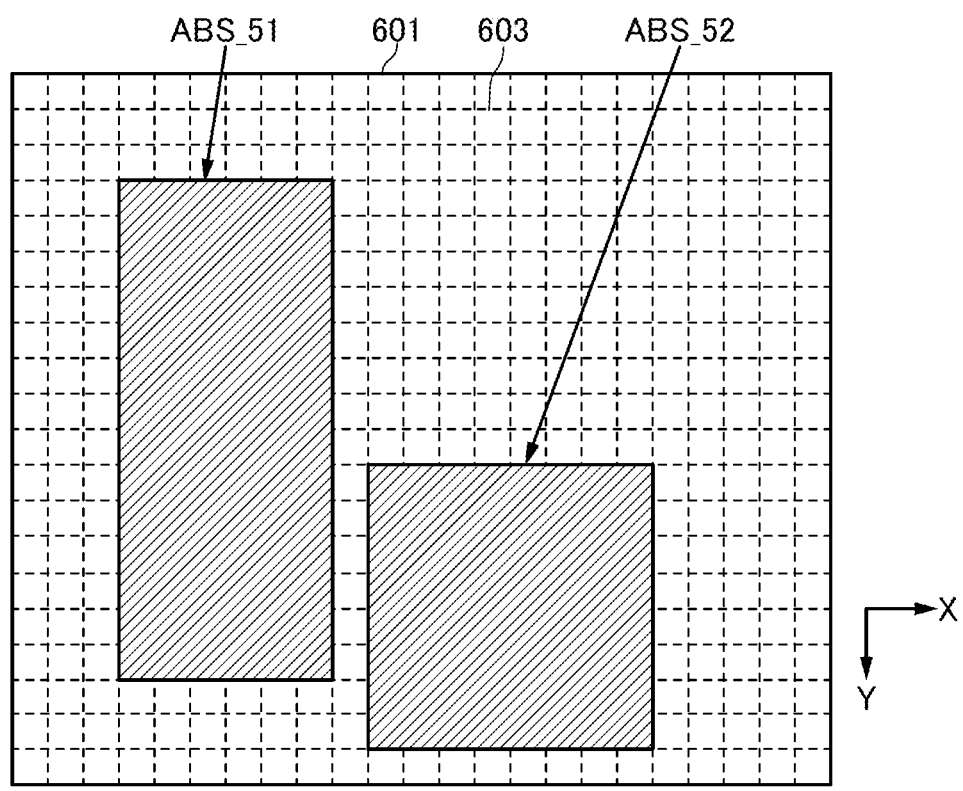

A method for connecting the connection points in Step S28 will be described using an example of a circuit including two elements. FIG. 20(A) shows a circuit diagram 341 of a memory circuit composed of one transistor element Tr51 and one capacitor C52. FIG. 20(A) includes a word line WL, a bit line BL, and a ground potential line GND in addition to the elements. Note that a circuit example including two elements is shown for simple description; however, one embodiment of the present invention is not limited thereto. FIG. 20(B) shows an example of a layout in the case where the movement at selected in Step S27 is performed. FIG. 20(B) shows an abstract ABS_51 corresponding to the transistor element Tr51 and an abstract ABS_52 corresponding to the capacitor C52.

Figure 21A:
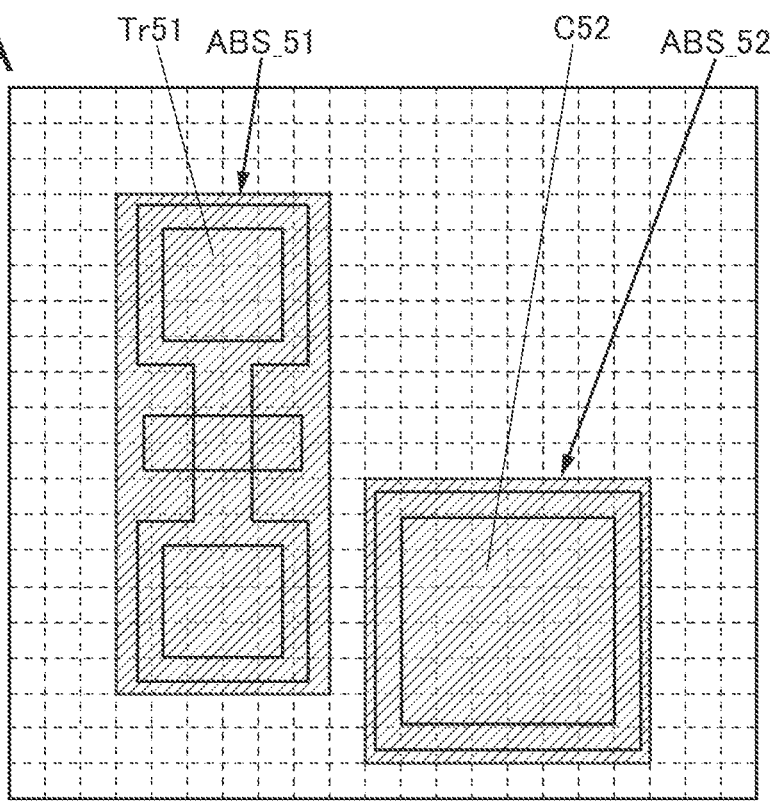
FIGS. 21A-21B Diagrams illustrating examples of an abstract and a connection point.

FIG. 21(A) illustrates the transistor element Tr51, the abstract ABS_51 corresponding to the transistor element Tr51, the capacitor C52, and the abstract ABS_52 corresponding to the capacitor C52. The hatchings of the abstract ABS_51 and the abstract ABS_52 are illustrated transparently in FIG. 21(A) so that the positional relationships are clearly shown.

Figure 21B:
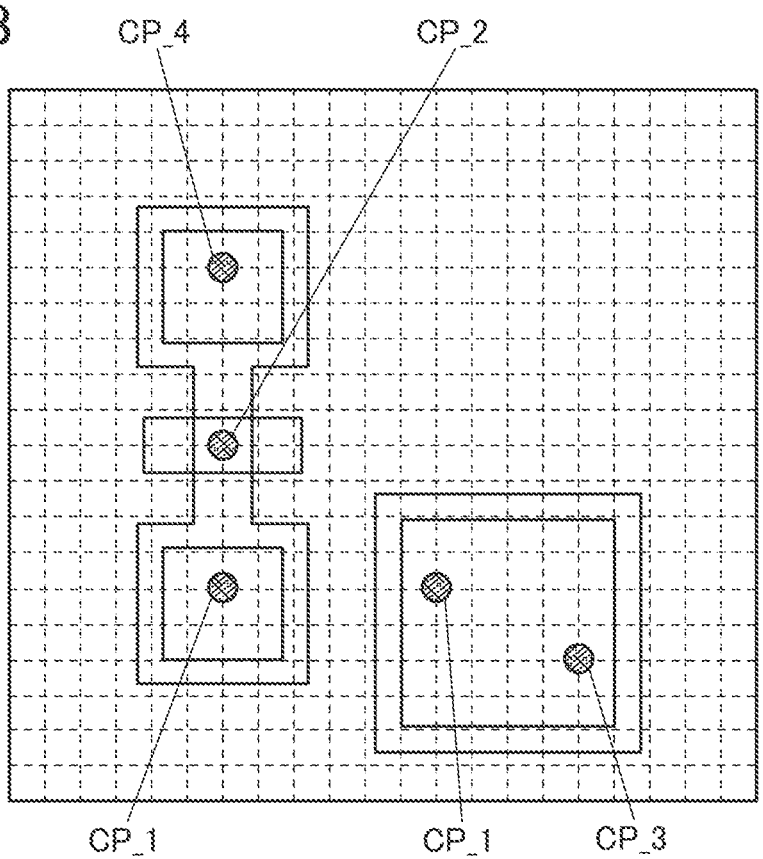

FIG. 21(B) shows an example of connection points of the transistor element Tr51 and the capacitor C52. The transistor element Tr51 includes a connection point CP_2 in a region of the gate electrode, a connection point CP_1 in a region of the source electrode, and a connection point CP_4 in a region of the drain electrode. The capacitor C52 includes the connection point CP_1 in a region of the upper electrode and CP_3 in a region of the lower electrode. The connection point is provided on the grid in the connection region. Note that in FIG. 21(B), for easy understanding of connection relationships, the connection points electrically connected to each other are denoted with the same reference numeral. Denoting the connection points with the same reference numeral means that they are connected with a wiring. For example, expressed is that the connection point CP_1 of the transistor element Tr51 and the connection point CP_1 of the capacitor C52 are connected with a wiring.

Figure 22A:
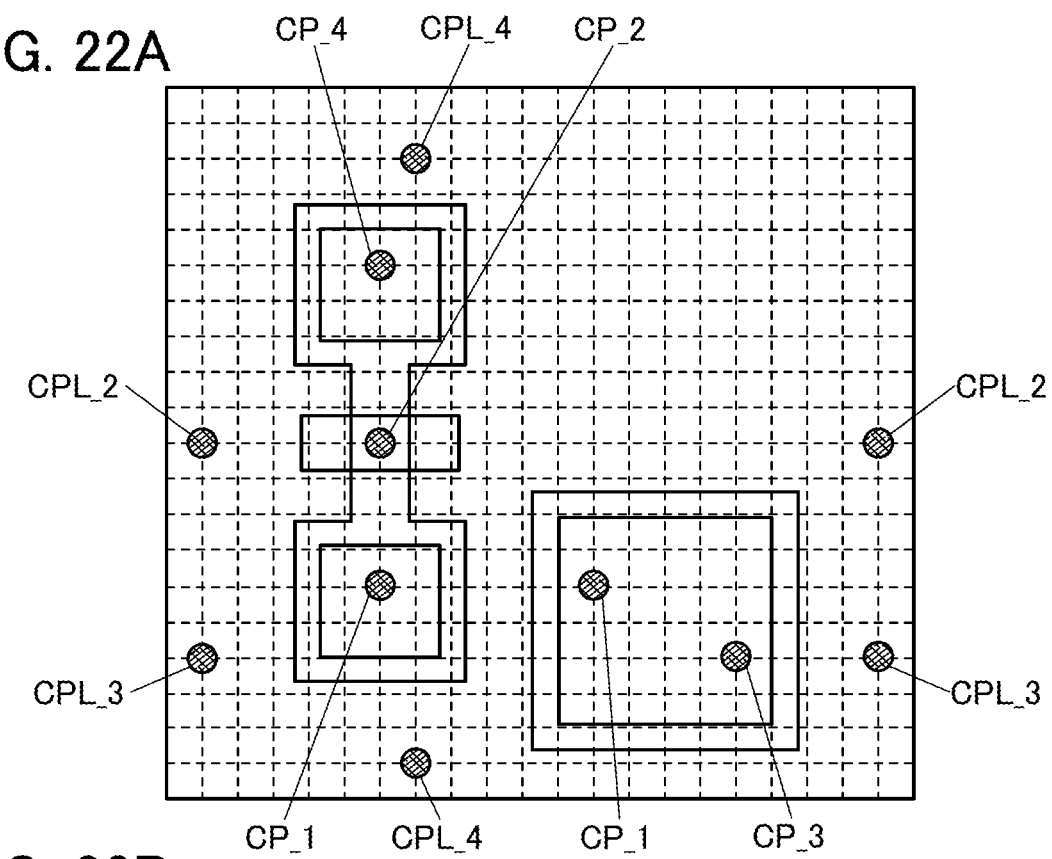
FIGS. 22A-22B Diagrams illustrating examples of a connection point and a wiring.

Next, the connection point of a signal line is arranged on the grid. The connection point of the signal line can be arranged at an arbitrary position on the grid. FIG. 22(A) shows examples of connection points of a word line WL, a ground potential line GND, and a bit line BL with respect to the elements shown in FIG. 21(B). FIG. 22(A) shows a connection point CPL_2 of the word line WL, a connection point CPL_3 of the ground potential line GND, and a connection point CPL_4 of the bit line BL. The connection point CPL_2 of the word line WL is a connection point that is connected to the connection point CP_2 of the transistor element Tr51 with a wiring. The connection point CPL_3 of the ground potential line GND is a connection point that is connected to a connection point CP_3 of the capacitor C52 with a wiring. The connection point CPL_4 of the bit line BL is a connection point connected to the connection point CP_4 of the transistor element Tr51 with a wiring. The wiring connecting the connection points is provided only on the grid.

Figure 22B:
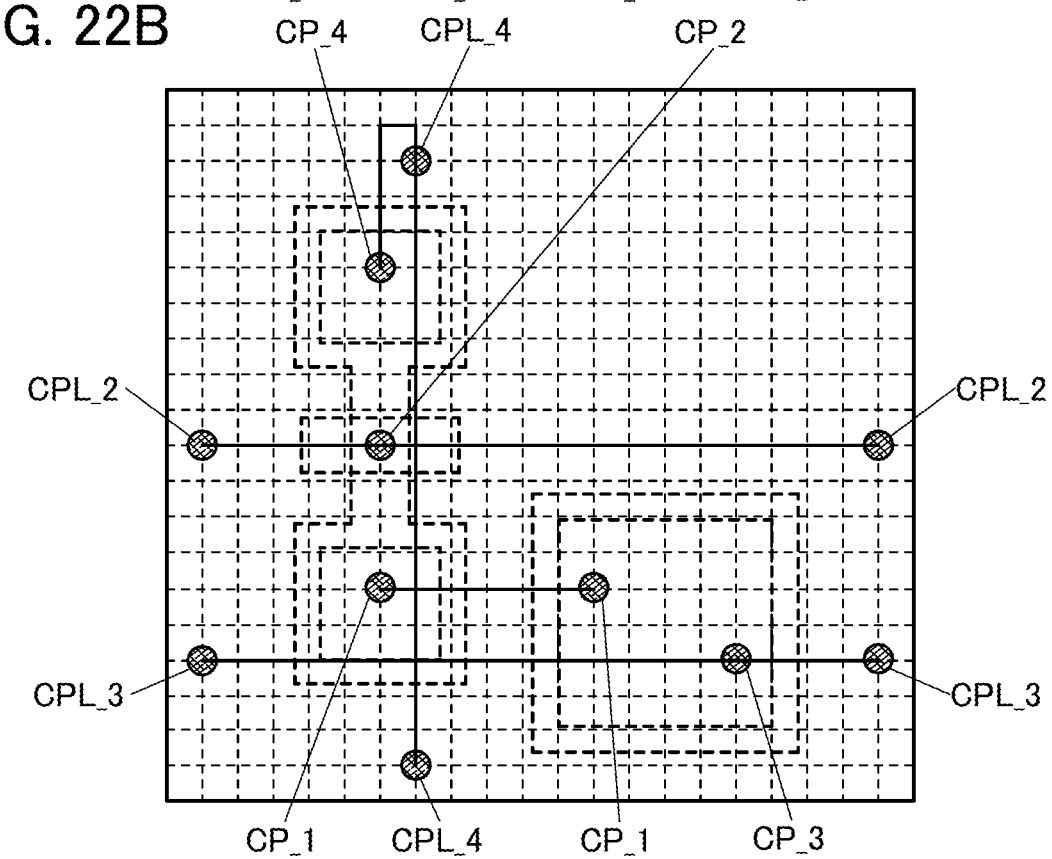

FIG. 22(B) shows wirings for the connection points illustrated in FIG. 22(A). FIG. 22(B), in which wirings are denoted with solid lines, shows an example where examples of wirings that satisfy all the connection relationships based on the circuit diagram 341 can be arranged.

As an algorithm for determining a path of a wiring, a line search method, a maze method, a channel allocation method, or the like can be used. In this embodiment, a line search method is preferably used. In a line search method, line segments are sequentially formed in the X-axis direction and the Y-axis direction from the two points which are to be connected, and when the line segment from the starting point and the line segment from the ending point intersect with each other, a path is determined by following from the point in the reverse direction.

In the case where wirings satisfying all the connection relationships based on the circuit diagram can be arranged (Yes), the process goes to Step S29. In the case where wirings cannot be arranged (No), the process goes to Step S36.

[Step S29]

Step S29 is a step of determining whether a design rule is satisfied or not, by the processing portion 103.

Figure 23:
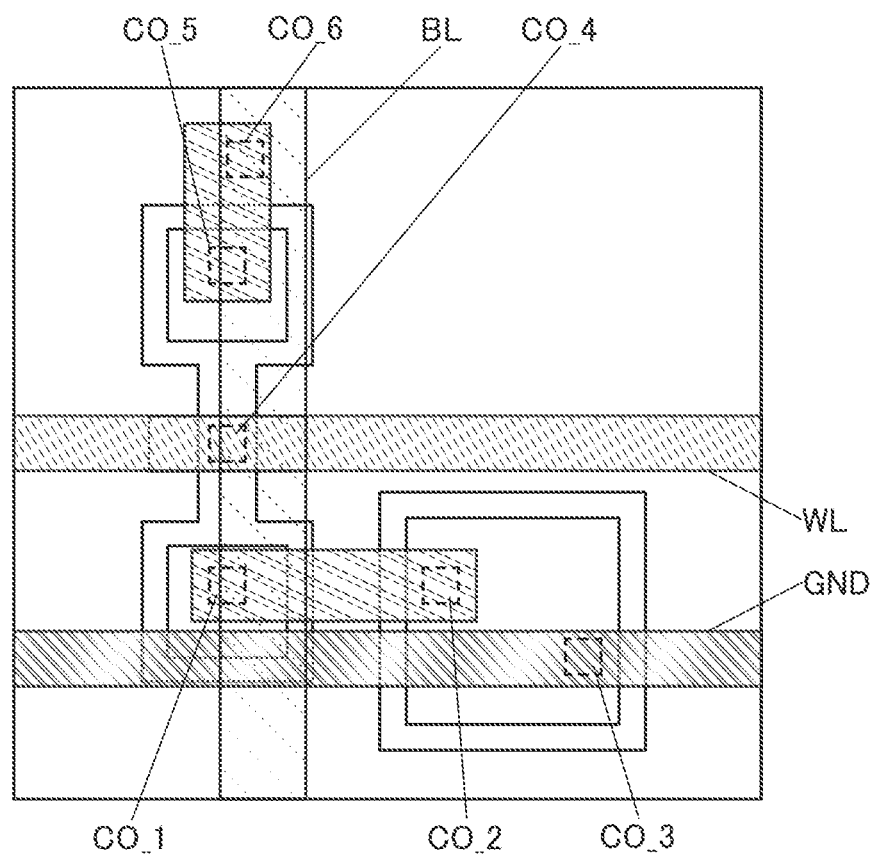
FIG. 23 A diagram illustrating an example of layout data.

An object subject to the determination is a layout obtained by conversion of the arrangement of the elements and wirings generated in Step S28 into patterns of the elements and wirings. The criteria for the determination is the design rule. FIG. 23 shows a diagram of the arrangement of the elements and wirings shown in FIG. 22(B) that is converted into the patterns of the elements and wirings. FIG. 23 is an example of layout data. The pattern of a wiring can be within the range of the maximum value and the minimum value of the wiring width defined in the design rule. Some connection points are converted into contact holes. The size of a contact hole can be within the range of the maximum value and the minimum value of the size of a contact hole defined in the design rule. FIG. 23 shows a diagram in which some connection points are converted into a contact hole CO_1 to a contact hole CO_6.

In the case where the layout of the pattern satisfies the design rule (Yes), the process goes to Step S30. In the case where the design rule is not satisfied (No), the process goes to Step S36.

Figure 24A:
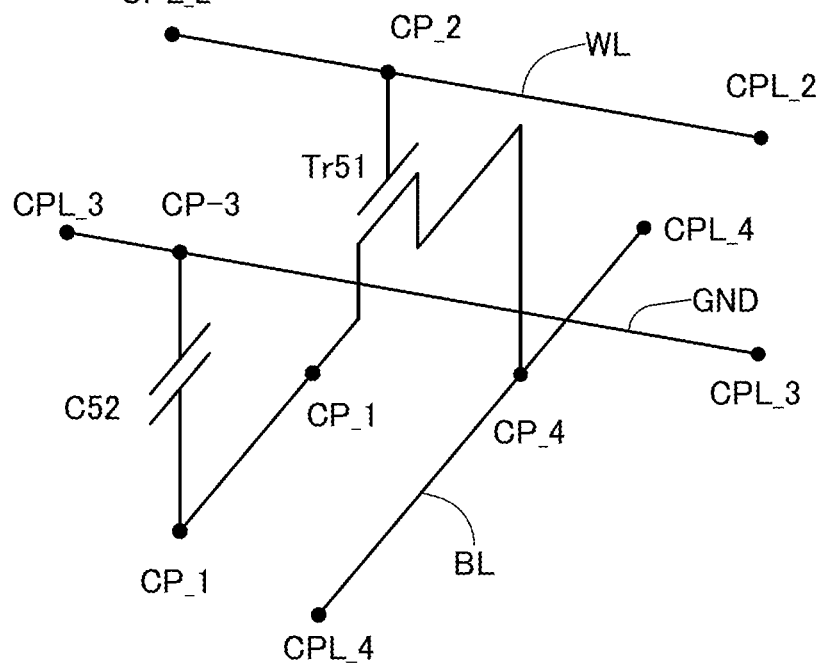
FIGS. 24A-24B Diagrams illustrating an example of a layout.
Figure 24B:
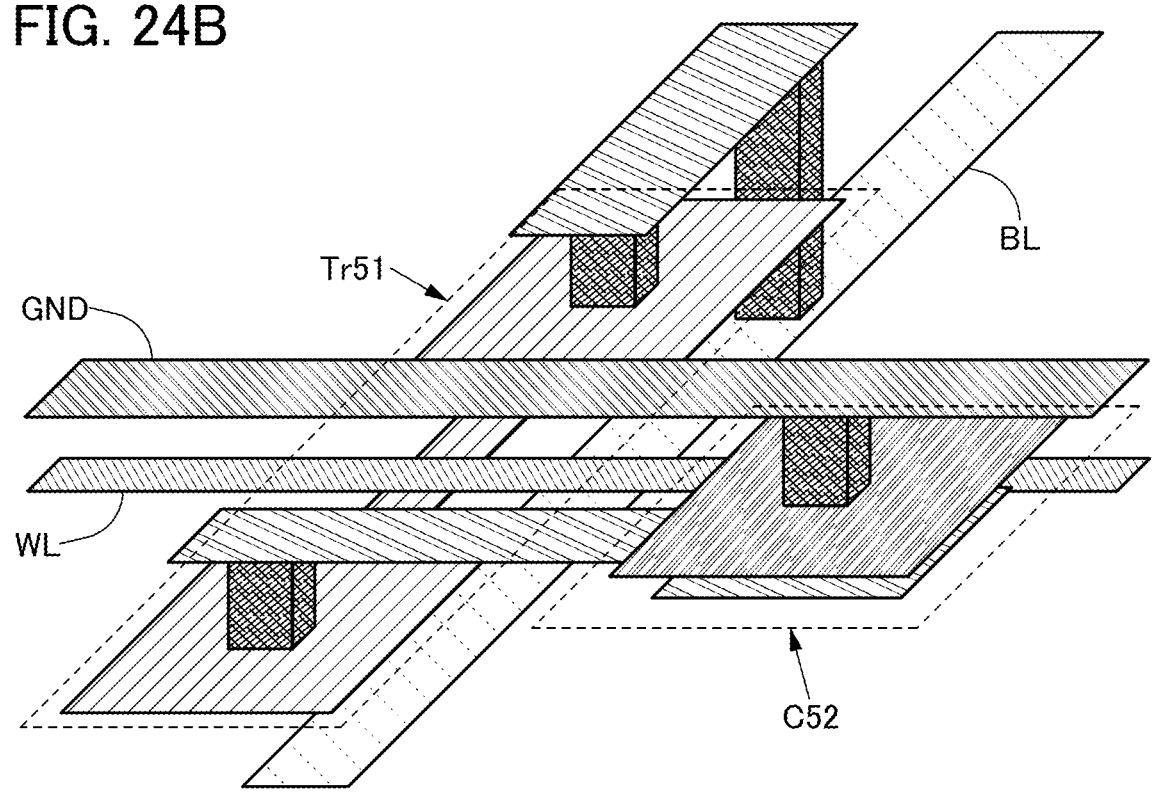

FIG. 24(B) is a schematic view three-dimensionally illustrating the layout illustrated in FIG. 23. FIG. 24(A) is a schematic view three-dimensionally illustrating the circuit configuration. The use of the layout design system that is one embodiment of the present invention makes it possible to generate layout data which satisfies a circuit diagram generated through circuit design and a design rule and in which an integrated circuit has a small area.

[Step S30]

Step S30 is a step of moving an abstract by the processing portion 103. This movement complies with the movement at selected in Step S27.

Figure 25:
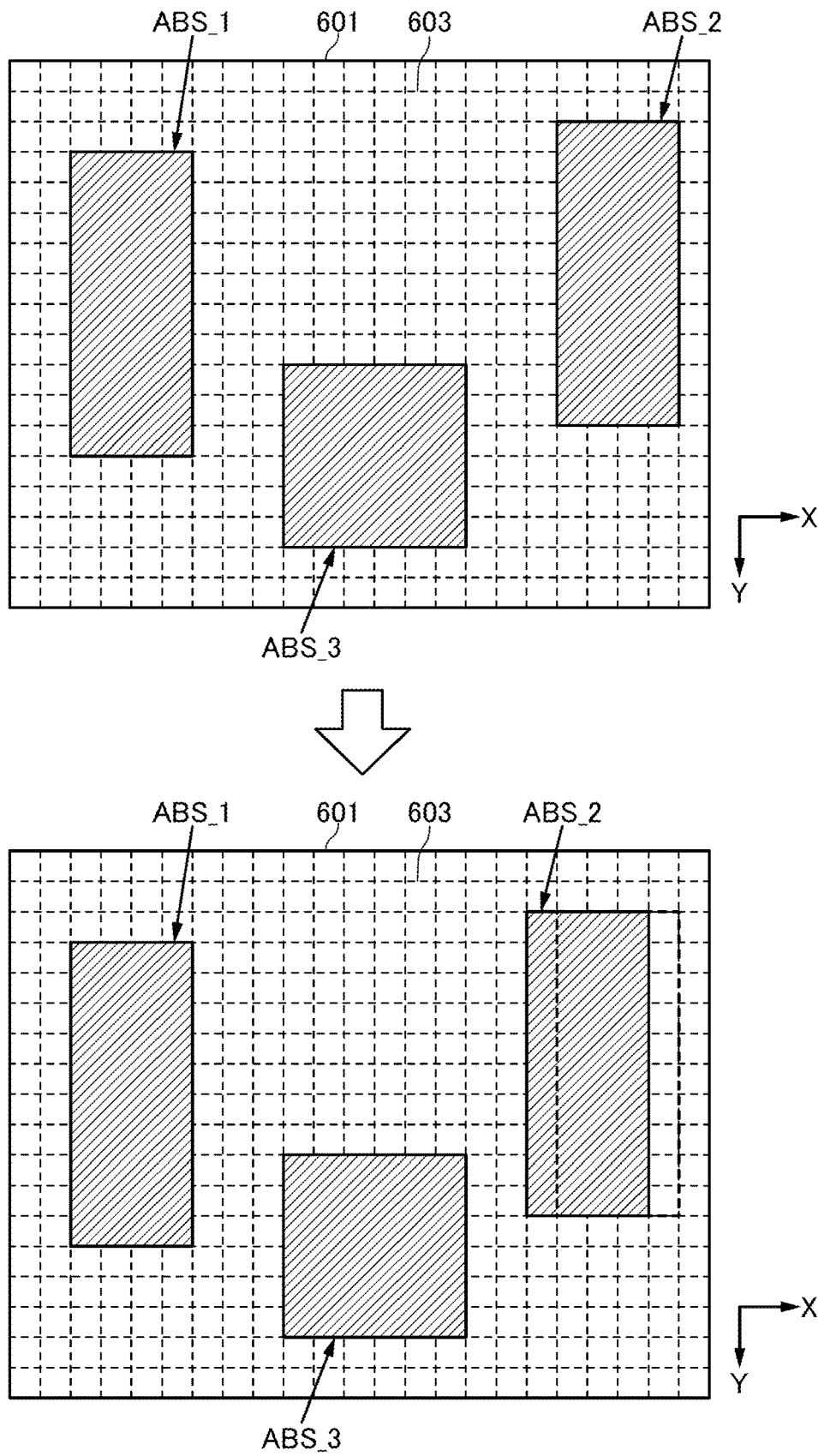
FIG. 25 A diagram illustrating an example of a movement of an abstract.

FIG. 25 shows an example of a movement in a layout which includes three abstracts of the abstract ABS_1 to the abstract ABS_3. FIG. 25 illustrates an example in which moving of the abstract ABS_2 in the X-axis direction by −1 is selected as the movement at selected in Step S27. In this embodiment, the number of the abstracts that move in one episode is one as illustrated in FIG. 25; however, one embodiment of the present invention is not limited thereto. A structure in which a plurality of abstracts move may be employed.

[Step S31]

Step S31 is a step of observing the layout state $s_{t+1}$ of an abstract by the processing portion 103.

The layout state $s_{t+1}$ is the layout state $s_t$ in Step S25 which has been changed by the movement at in Step S27. The layout state $s_{t+1}$ is stored in the memory portion 105 as image data $LIMG_{t+1}$ of a layout.

[Step S32]

Step S32 is a step of estimating the action value function $Q(s_{t+1},a_{t+1})$ by the processing portion 103.

In general, in learning of deep learning, the weight coefficient of a neural network is updated such that an error between output data and teacher data becomes small. The update of a weight coefficient is repeated until the error between the output data and the teacher data becomes a certain value. In Q learning, which is a kind of reinforcement learning, the purpose of the learning is to search for the optimal Q function; however, the optimal Q function is not found during the learning. Thus, an action value function $Q(s_{t+1},a_{t+1})$ at the next time t+1 is estimated, and $r_{t+1}$+maxQ $(s_{t+1},a_{t+1})$ is regarded as teacher data. The first neural network 520 performs learning by using the teacher data for a loss function.

The processing portion 103 includes a second neural network 530 and estimates the action value function $Q(s_{t+1},a_{t+1})$ with the second neural network 530. In the second neural network 530, the input data is the image data $LIMG_{t+1}$ of the layout generated in Step S31 and the output data is the action value function $Q(s_{t+1},a_{t+1})$. For the second neural network 530, a convolutional neural network (CNN) configuration is preferably employed.

FIG. 17(B) illustrates the configuration of the second neural network 530. FIG. 17(B) illustrates an example where a convolutional neural network (CNN) configuration is used for a neural network. The second neural network 530 illustrated in FIG. 17(B) includes an input layer 531, an intermediate layer 532, and an output layer 533. The image data $LIMG_{t+1}$ of the layout, which is the input data, is shown in the input layer 531; an action value function $Q(s_{t+1},a^1)$ to an action value function $Q(s_{t+1},a^m)$ are shown as output data. In the layout state $s_t$, there are m possible movements of a movement $a^1$ to a movement $a^m$, and action value functions corresponding to the movements are denoted by $Q(s_1,a^1)$ to the action value function $Q(s_{t+1},a^m)$.

The sum of the highest Q value among the action value function $Q(s_{t+1},a^1)$ to the action value function $Q(s_{t+1},a^m)$ and the reward $r_{t+1}$ can be used as the teacher data for the inference by the first neural network.

In FIG. 17(B), the intermediate layer 532 includes a convolution layer 534, a pooling layer 535, a convolution layer 536, a pooling layer 537, a convolution layer 538, and a fully-connected layer 539. Note that the configuration of the intermediate layer 532 is an example and a configuration in which pooling processing and convolution operation processing are conducted with a larger number of layers, or a configuration in which pooling processing and convolution operation processing are conducted through operation processings such as padding and stride may be employed. Note that a filter is not shown in FIG. 17(B).

Note that one neural network may be used in Step S27 and Step S32. Different neural networks may be used in Step S27 and Step S32.

[Step S33]

Step S33 is a step of receiving the reward $r_{t+1}$ and updating the action value function $Q(s_t,a_t)$ by the processing portion 103.

The reward $r_{t+1}$ is a reward for the movement at of the abstract in Step S30. The area of the block BLK after the movement at is performed is calculated, and the reward $r_{t+1}$ depending on the area of the block BLK is determined in accordance with the reward setting set in Step S24. Note that no reward may be given in Step S33, i.e., the reward $r_{t+1}=0$ may be employed.

Results of the inference of the action value function $Q(s_t,a_t)$ by the first neural network 520 and the teacher data generated by the second neural network 530 are used to calculate a loss function. With the use of a stochastic gradient descent (SGD), the weight coefficient of the first neural network 520 is updated such that the value of the loss function becomes small. Besides stochastic gradient descent, Adam (Adaptive Moment Estimation), momentum (Momentum), AdaGrad (Adaptive SubGradient Methods), RMSProp, or the like can be used.

[Step S34]

Step S34 is a step of determining whether a termination condition A is satisfied or not, by the processing portion 103. In the case where the termination condition A is satisfied (Yes), the process goes to Step S35. In the case where the termination condition A is not satisfied (No), the process goes to the observation of the layout state in Step S26. Hereafter, by repeating Step S26 to Step S33, the weight coefficients of the first neural network 520 and the second neural network 530 are updated, and the first neural network 520 and the second neural network 530 are optimized. By optimizing the first neural network 520 and the second neural network 530, the layout design system 100 can perform layout design for a small area satisfying a design rule, within a short period of time.

As the termination condition A, the time elapsed from the start of the layout design flow shown in FIG. 5 and FIG. 6 can be used. Setting the termination condition A makes it possible to prevent the layout design from not ending owing to the algorithm that does not converge.

[Step S35]

Step S35 is a step of determining whether a termination condition B is satisfied or not by the processing portion 103. In the case where the termination condition B is satisfied (Yes), the layout design ends and layout data is output. As the layout data, the layout data shown in FIG. 23 can be output, for example. In the case where the termination condition B is not satisfied (No), the process goes to the arrangement of abstracts in Step S25, learning proceeds from the initial arrangement of abstracts. Hereafter, by repeating Step S26 to Step S33, the weight coefficients of the first neural network 520 and the second neural network 530 are updated, and the first neural network 520 and the second neural network 530 are optimized. By optimizing the first neural network 520 and the second neural network 530, the layout design system 100 can perform layout design for a small area satisfying a design rule, within a short period of time.

As the termination condition B, for example, the number of episodes can be used.

[Step S36]

In the case where connection points cannot be connected in Step S28 or in the case where a design rule is not satisfied in Step S29, the process goes to Step S36. In Step S36, the processing portion 103 receives the reward $r_t$, and the action value function $Q(s_t,a_t)$ is updated. The reward $r_t$ in Step S36 is a value smaller than that of the reward $r_t$ in Step S33. As the reward $r_t$, a negative value may be used. For example, the reward $r_t$ can be −1.

In this manner, layout design can be performed.

When layout design is performed using different circuit diagrams and different design rules, a versatile layout design system can be obtained.

3. Layout Design Method 2

A layout design method which is different from the layout design method described in <2. Layout design method 1> above will be described. The method for estimating the action value function $Q(s_t,a_t)$ in Step S27 is different from that of <2. Layout design method 1>. The above description can be referred to for the other steps and thus, the detailed description thereof is omitted.

[Step S27]

In Step S27, the processing portion 103 estimates the action value function $Q(s_t,a_t)$. The processing portion 103 includes the first neural network 520 and estimates the action value function $Q(s_t,a_t)$ with the first neural network 520. In the first neural network 520, the input data is the image data $LIMG_t$ of the layout generated in Step S26 and the output data is the action value function $Q(s_t,a_t)$. For the first neural network 520, a convolutional neural network (CNN) configuration is preferably employed.

The above description can be referred to for the configuration of the first neural network 520 and thus, the detailed description thereof is omitted.

The possible movement at of an abstract will be described. An object subject to the estimation of the action value function $Q(s_t,a_t)$ in one episode is one abstract ABS. The movement at of one abstract can be of six kinds: moving in the X-axis direction by +1; moving in the X-axis direction by −1; moving in the Y-axis direction by +1; moving in the Y-axis direction by −1; rotating 90° in place; and not moving.

One abstract to be moved among k abstracts of the abstract ABS_1 to the abstract ABS_k is referred to as an abstract ABS_i. Table 2 lists examples of output data in the case where the abstract ABS_i can perform the above-described six kinds of movements. There are six kinds of movements of a movement $a^1$ to a movement $a^6$ that can be performed by one abstract ABS_i, and there can be six pieces of output data of the action value function $Q(s_t,a^1)$ to the action value function $Q(s_t,a^6)$.

TABLE 2

| | Movement a | | |
|---|---|---|---|
| Output data | Movement a | Abstract to be moved | Details of movement |
| $Q(s_t, a^1)$ | $a^1$ | ABS_i | +1 in X-axis direction |
| $Q(s_t, a^2)$ | $a^2$ | | −1 in X-axis direction |
| $Q(s_t, a^3)$ | $a^3$ | | +1 in Y-axis direction |
| $Q(s_t, a^4)$ | $a^4$ | | −1 in Y-axis direction |
| $Q(s_t, a^5)$ | $a^5$ | | 90° rotation |
| $Q(s_t, a^6)$ | $a^6$ | | No movement |

One abstract ABS_i is to be moved in one episode, and one abstract ABS_(i+1) different from that in the previous episode is to be moved in the next episode. When an object to be moved in one episode is one abstract, the number of pieces of output data of the neural network can be fixed and a versatile neural network can be obtained.

4. Layout Design Method 3

In the methods described in <2. Layout design method 1> and <3. Layout design method 2> above, the weight coefficients of the first neural network 520 and the second neural network 530 are repeatedly updated and the neural networks are made to perform learning. A method in which these neural networks that have performed learning are used to perform layout design will be described. FIG. 7 shows a flow of layout design.

[Step S101]

Step S101 is a step of acquiring a circuit diagram and layout design information.

The above description of Step S21 can be referred to for Step S101 and thus, the detailed description thereof is omitted.

[Step S102]

Step S102 is a step of generating a grid by the processing portion 103.

The above description of Step S22 can be referred to for Step S102 and thus, the detailed description thereof is omitted.

[Step S103]

Step S103 is a step of generating a basic cell and an abstract in the grid frame by the processing portion 103.

The above description of Step S23 can be referred to for Step S103 and thus, the detailed description thereof is omitted.

[Step S104]

Step S104 is a step of arranging an abstract in a layout frame randomly by the processing portion 103.

The above description of Step S25 can be referred to for Step S104 and thus, the detailed description thereof is omitted.

[Step S105]

Step S105 is a step of observing the layout state $s_t$ of an abstract by the processing portion 103.

The above description of Step S26 can be referred to for Step S105 and thus, the detailed description thereof is omitted.

[Step S106]

Step S106 is a step of estimating the action value function $Q(s_t, a_t)$ by the processing portion 103.

The above description of Step S27 can be referred to for Step S106 and thus, the detailed description thereof is omitted.

[Step S107]

Step S107 is a step of determining whether connection points can be connected or not, by the processing portion 103.

The above description of Step S28 can be referred to for Step S107 and thus, the detailed description thereof is omitted.

In the case where wirings satisfying all the connection relationships based on the circuit diagram can be arranged (Yes), the process goes to Step S108. In the case where wirings cannot be arranged (No), the process goes to Step S104. The abstracts are set to the initial arrangement in Step S104 and the layout processing resumes from the initial arrangement.

[Step S108]

Step S108 is a step of determining whether a design rule is satisfied or not, by the processing portion 103.

The above description of Step S29 can be referred to for Step S108 and thus, the detailed description thereof is omitted.

In the case where the layout of the pattern satisfies the design rule (Yes), the process goes to Step S109. In the case where the design rule is not satisfied (No), the process goes to Step S104. The abstracts are set to the initial arrangement in Step S104 and the layout processing resumes from the initial arrangement.

[Step S109]

Step S109 is a step of moving an abstract by the processing portion 103. This movement complies with the movement at selected in Step S106.

The above description of Step S30 can be referred to for Step S109 and thus, the detailed description thereof is omitted.

[Step S110]

Step S110 is a step of determining whether a termination condition C is satisfied or not, by the processing portion 103. In the case where the termination condition C is satisfied (Yes), the layout design ends. In the case where the termination condition C is not satisfied (No), the process goes to the observation of the layout state in Step S105.

As the termination condition C, for example, the number of episodes or the elapsed time from the start of the layout processing can be used.

With the use of the layout design system that is one embodiment of the present invention and that includes an optimized neural network, layout design for a small area satisfying a design rule can be performed within a short period of time.

5. Example of Layout Design System

A layout design system different from the layout design system 100 illustrated in FIG. 1 will be described.

Figure 26:
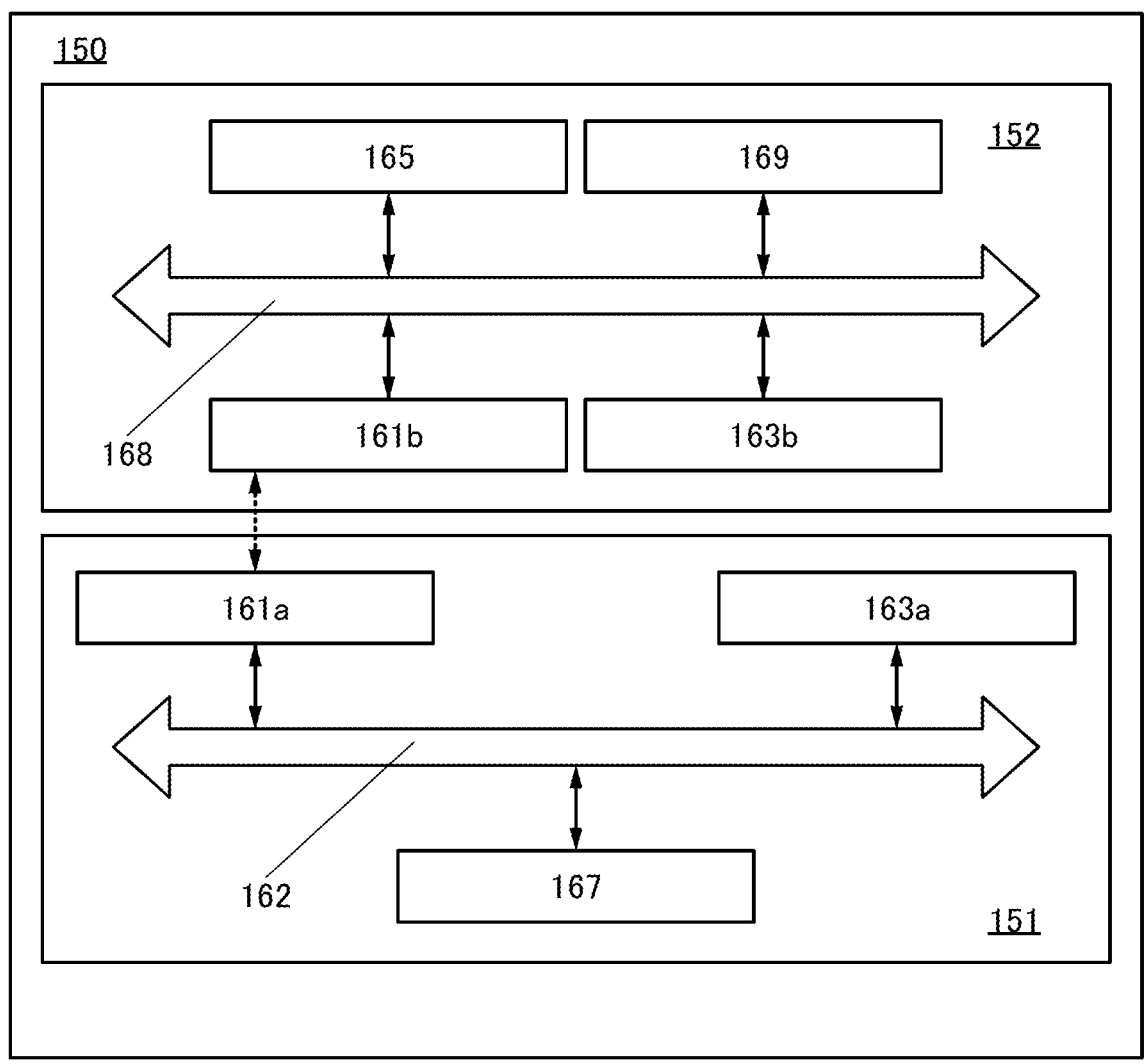
FIG. 26 A block diagram illustrating an example of a layout design system.

FIG. 26 shows a block diagram of a layout design system 150. The layout design system 150 includes a server 151 and a terminal 152 (such as a personal computer).

The server 151 includes a communication portion 161a, a transmission path 162, a processing portion 163a, and a database 167. The server 151 may further include a memory portion, an input/output portion, or the like, although not illustrated in FIG. 26.

The terminal 152 includes a communication portion 161b, a transmission path 168, a processing portion 163b, a memory portion 165, and an input/output portion 169. The terminal 152 may further include a database or the like, although not illustrated in FIG. 26.

The user of the layout design system 150 inputs the circuit diagram and the layout design information used for layout design from the terminal 152 to the server 151. The data is transmitted from the communication portion 161b to the communication portion 161a.

The data received by the communication portion 161a is stored in the database 167 or a memory portion (not illustrated) through the transmission path 162. Alternatively, the data may be directly supplied to the processing portion 163a from the communication portion 161a.

The above-described layout design is performed in the processing portion 163a. These processings require high processing capacity, and thus are preferably performed in the processing portion 163a of the server 151.

Layout data is generated by the processing portion 163a. The layout data is stored in the database 167 or the memory portion (not illustrated) through the transmission path 162. Alternatively, the data may be directly supplied to the communication portion 161a from the processing portion 163a. After that, the layout data is output from the server 151 to the terminal 152. The data is transmitted from the communication portion 161a to the communication portion 161b.

[Input/Output Portion 169]

Information is supplied to the input/output portion 169 from the outside of the layout design system 150. The input/output portion 169 has a function of supplying information to the outside of the layout design system 150. Note that an input portion and an output portion may be separated from each other as in the layout design system 100.

[Transmission Path 162 and Transmission Path 168]

The transmission path 162 and the transmission path 168 have a function of transmitting information. Transmission and reception of information between the communication portion 161a, the processing portion 163a, and the database 167 can be performed through the transmission path 162. Transmission and reception of information between the communication portion 161b, the processing portion 163b, the memory portion 165, and the input/output portion 169 can be performed through the transmission path 168.

[Processing Portion 163a and Processing Portion 163b]

The processing portion 163a has a function of performing an operation, inference, or the like with the use of information supplied from the communication portion 161a, the database 167, or the like. The processing portion 163b has a function of performing an operation or the like with the use of information supplied from the communication portion 161b, the memory portion 165, the input/output portion 169, or the like. The description of the processing portion 103 can be referred to for the processing portion 163a and the processing portion 163b. Specifically, the processing portion 163a can perform the above-described layout design processing. Thus, the processing portion 163a preferably has higher processing capacity than the processing portion 163b.

[Memory Portion 165]

The memory portion 165 has a function of storing a program to be executed by the processing portion 163b. The memory portion 105 has a function of storing an operation result generated by the processing portion 163b, information input to the communication portion 161b, information input to the input/output portion 169, and the like.

[Database 167]

The database 167 has a function of storing layout design information. The database 167 may have a function of storing an operation result generated by the processing portion 163a, information input to the communication portion 161a, and the like. Alternatively, the server 151 may include a memory portion in addition to the database 167, and the memory portion may have a function of storing an operation result generated by the processing portion 163a, information input to the communication portion 161a, and the like.

[Communication Portion 161a and Communication Portion 161b]

Information can be transmitted and received between the server 151 and the terminal 152 with the use of the communication portion 161a and the communication portion 161b. As the communication portion 161a and the communication portion 161b, a hub, a router, a modem, or the like can be used. Information may be transmitted and received through wire communication or wireless communication (e.g., radio waves or infrared light).

As described above, the layout design system in this embodiment can generate layout data from a circuit diagram input, on the basis of layout design information that has been prepared in advance.

This embodiment can be combined with the other embodiments as appropriate. In this specification, in the case where a plurality of structure examples are shown in one embodiment, the structure examples can be combined as appropriate.

Embodiment 2

In this embodiment, structure examples of a semiconductor device that can be used in the neural networks described in the above embodiment are described.

Figure 27A:
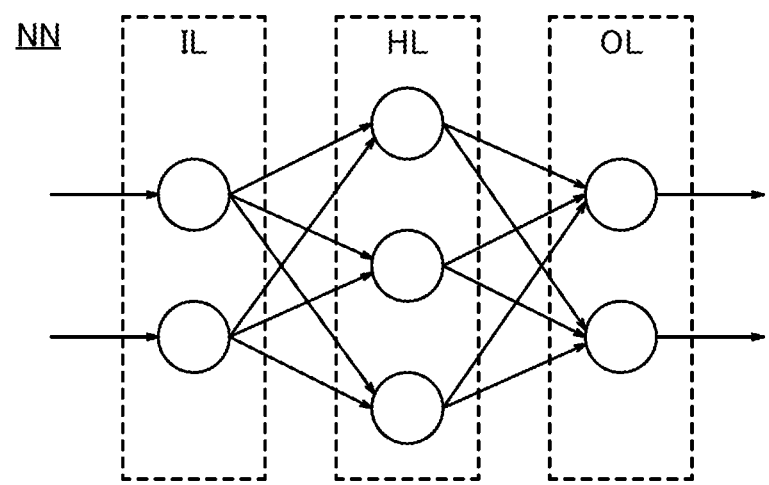
FIGS. 27A-27B Diagrams illustrating a configuration example of a neural network.

As illustrated in FIG. 27(A), a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network), and learning using a deep neural network can also be referred to as deep learning.

Input data is input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 27B:
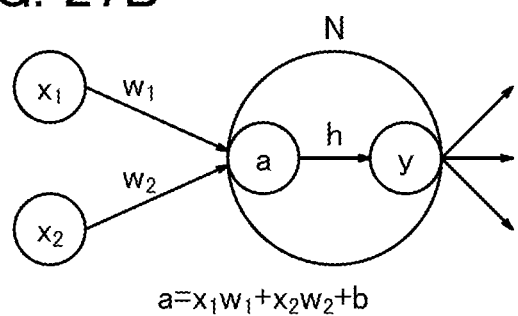

FIG. 27(B) illustrates an example of an operation with the neurons. Here, a neuron N and two neurons in the previous layer which output signals to the neuron N are shown. An output $x_1$ of the neuron in the previous layer and an output $x_2$ of the neuron in the previous layer are input to the neuron N. Then, in the neuron N, a total sum $x_1w_1+x_2w_2$ of the product of the output $x_1$ and a weight $w_1$ ($x_1w_1$) and the product of the output $x_2$ and a weight $w_2$ ($x_2w_2$) is calculated, and then a bias b is added as necessary, so that a value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed using hardware, a product-sum operation circuit can be used. A digital circuit or an analog circuit may be used as this product-sum operation circuit. When an analog circuit is used as the product-sum operation circuit, the circuit scale of the product-sum operation circuit can be reduced, or higher processing speed and lower power consumption can be achieved owing to reduced frequency of access to a memory.

The product-sum operation circuit may include a transistor including silicon (such as single crystal silicon) in a channel formation region (hereinafter also referred to as a Si transistor) or a transistor including an oxide semiconductor in a channel formation region (hereinafter also referred to as an OS transistor). An OS transistor is particularly suitable as a transistor included in an analog memory of the product-sum operation circuit because of its extremely low off-state current. Note that the product-sum operation circuit may include both a Si transistor and an OS transistor. A configuration example of a semiconductor device having a function of the product-sum operation circuit is described below.

Configuration Example of Semiconductor Device

Figure 28:
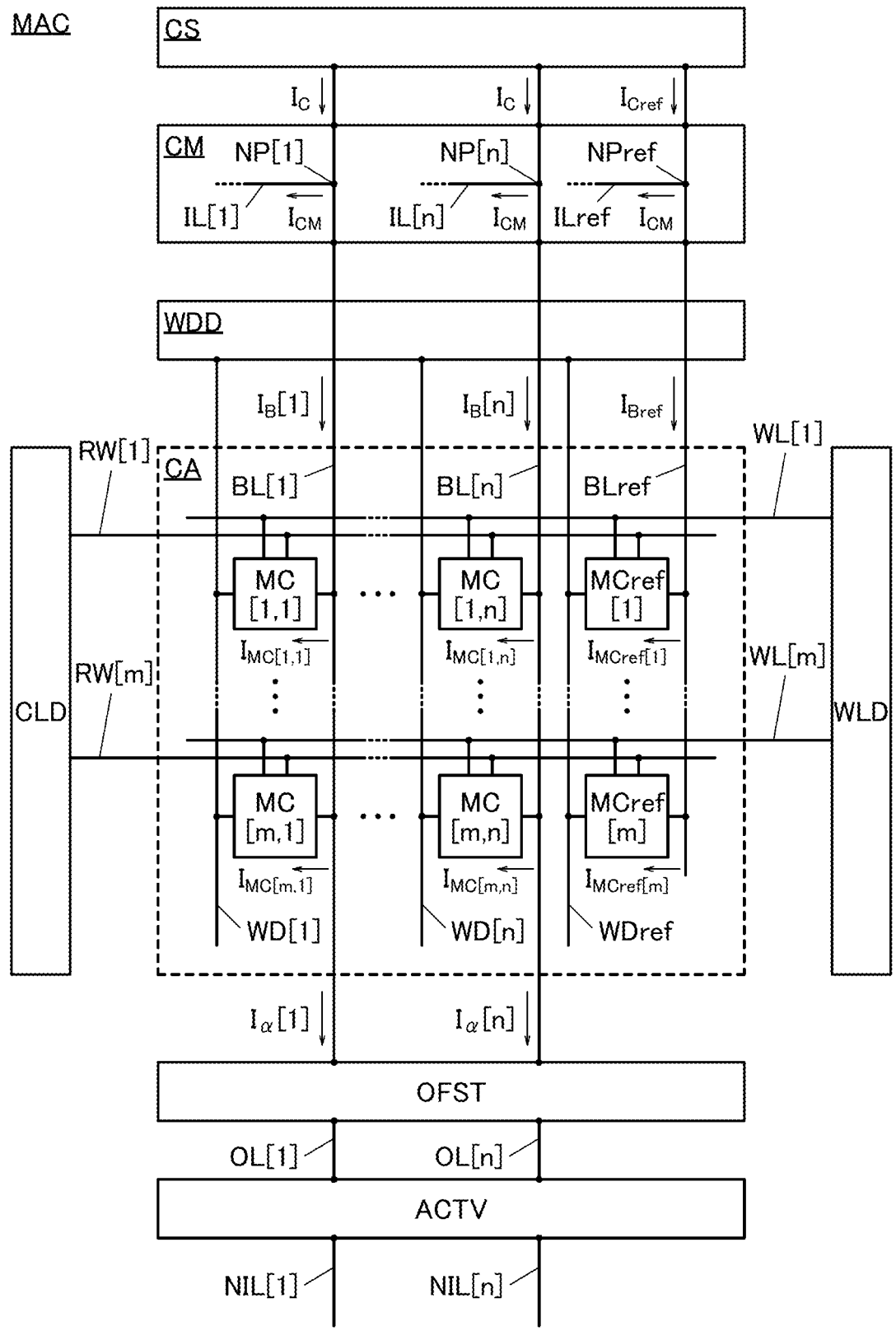
FIG. 28 A diagram illustrating a configuration example of a semiconductor device.

FIG. 28 illustrates a configuration example of a semiconductor device MAC having a function of performing an operation of a neural network. The semiconductor device MAC has a function of performing a product-sum operation of first data corresponding to the strength of connection (weight) between the neurons and second data corresponding to input data. Note that the first data and the second data can each be analog data or multilevel data (discrete data). The semiconductor device MAC also has a function of converting data obtained by the product-sum operation with the activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the configuration example illustrated in FIG. 28, the cell array CA includes the memory cells MC (MC[1, 1] to MC[m, n]) in m rows and n columns (m and n are integers greater than or equal to 1) and the m memory cells MCref (MCref[1] to MCref[m]). The memory cells MC have a function of storing the first data. In addition, the memory cells MCref have a function of storing reference data used for the product-sum operation. Note that the reference data can be analog data or multilevel data.

The memory cell MC[i, j] (i is an integer greater than or equal to 1 and less than or equal to m, and j is an integer greater than or equal to 1 and less than or equal to n) is connected to a wiring WL[i], a wiring RW[i], a wiring WD[j], and a wiring BL[j]. In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i, j]}$, and a current flowing between the memory cell MCref[i] and the wiring BLref is denoted by $I_{MCref[i]}$.

Figure 29:
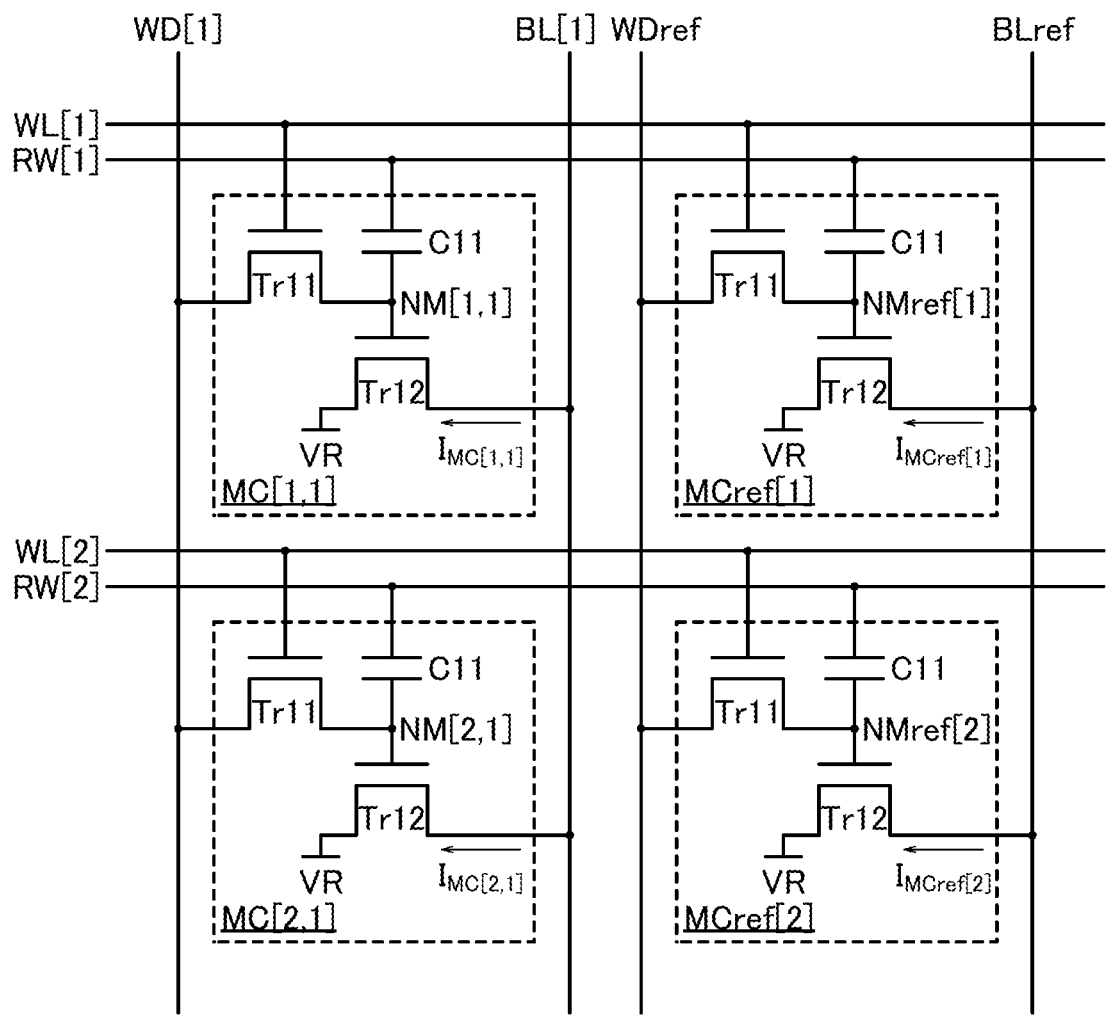
FIG. 29 A diagram illustrating a configuration example of a memory cell.

FIG. 29 illustrates a specific configuration example of the memory cell MC and the memory cell MCref. Although the memory cells MC[1, 1] and MC[2, 1] and the memory cells MCref[1] and MCref[2] are shown as typical examples in FIG. 29, similar configurations can also be used for other memory cells MC and other memory cells MCref. The memory cells MC and the memory cells MCref each include transistors Tr11 and Tr12 and a capacitor C11. Here, the case where the transistor Tr11 and the transistor Tr12 are n-channel transistors is described.

In the memory cell MC, a gate of the transistor Tr11 is connected to the wiring WL, one of a source and a drain of the transistor Tr11 is connected to a gate of the transistor Tr12 and a first electrode of the capacitor C11, and the other of the source and the drain of the transistor Tr11 is connected to the wiring WD. One of a source and a drain of the transistor Tr12 is connected to the wiring BL, and the other of the source and the drain of the transistor Tr12 is connected to a wiring VR. A second electrode of the capacitor C11 is connected to the wiring RW. The wiring VR is a wiring having a function of supplying a predetermined potential. Here, the case where a low power source potential (e.g., a ground potential) is supplied from the wiring VR is described as an example.

A node which is connected to the one of the source and the drain of the transistor Tr11, the gate of the transistor Tr12, and the first electrode of the capacitor C11 is referred to as a node NM. The nodes NM included in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to a wiring BLref instead of the wiring BL. A node in the memory cell MCref[1] and a node in the memory cell MCref[2], each of which is connected to one of the source and the drain of the transistor Tr11, the gate of the transistor Tr12, and the first electrode of the capacitor C11, are referred to as a node NMref[1] and a node NMref[2], respectively.

The node NM and the node NMref function as holding nodes of the memory cell MC and the memory cell MCref, respectively. The first data is held in the node NM and the reference data is held in the node NMref. Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 has a function of holding a potential of the node NM or the node NMref, the off-state current of the transistor Tr11 is preferably low. Thus, it is preferable to use an OS transistor, which has an extremely low off-state current, as the transistor Tr11. This can suppress a change in the potential of the node NM or the node NMref, so that the operation accuracy can be increased. Furthermore, operations of refreshing the potential of the node NM or the node NMref can be performed with low frequency, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying a current to the wirings BL[1] to BL[n] and the wiring BLref. Note that the value of the current supplied to the wirings BL[1] to BL[n] may be different from that of the current supplied to the wiring BLref Here, a current that is supplied from the current source circuit CS to the wirings BL[1] to BL[n] is denoted by $I_C$, and a current that is supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref Here, a connection portion between the wirings IL[1] to IL[n] and the wirings BL[1] to BL[n] are referred to as nodes NP[1] to NP[n]. Furthermore, a connection portion between the wiring ILref and the wiring BLref is referred to as a node NPref.

The current mirror circuit CM has a function of making a current $I_{CM}$ corresponding to the potential of the node NPref flow to the wiring ILref and a function of making this current $I_{CM}$ also flow to the wirings IL[1] to IL[n]. In the example illustrated in FIG. 28, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD has a function of supplying a potential corresponding to the first data stored in the memory cells MC to the wirings WD[1] to WD[n]. The circuit WDD also has a function of supplying a potential corresponding to the reference data stored in the memory cell MCref to the wiring WDref. The circuit WLD is connected to wirings WL[1] to WL[m]. The circuit WLD has a function of supplying a signal for selecting the memory cell MC or the memory cell MCref to which data is to be written, to any of the wirings WL[1] to WL[m]. The circuit CLD is connected to the wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of detecting the amount of a current flowing from the wirings BL[1] to BL[n] to the offset circuit OFST and/or the amount of change in the current flowing from the wirings BL[1] to BL[n] to the offset circuit OFST. The offset circuit OFST also has a function of outputting a detection result to the wirings OL[1] to OL[n]. Note that the offset circuit OFST may output a current corresponding to the detection result to the wiring OL, or may convert the current corresponding to the detection result into a voltage to output the voltage to the wiring OL. The currents flowing between the cell array CA and the offset circuit OFST are denoted by $I_\alpha[1]$ to $I_\alpha[n]$.

Figure 30:
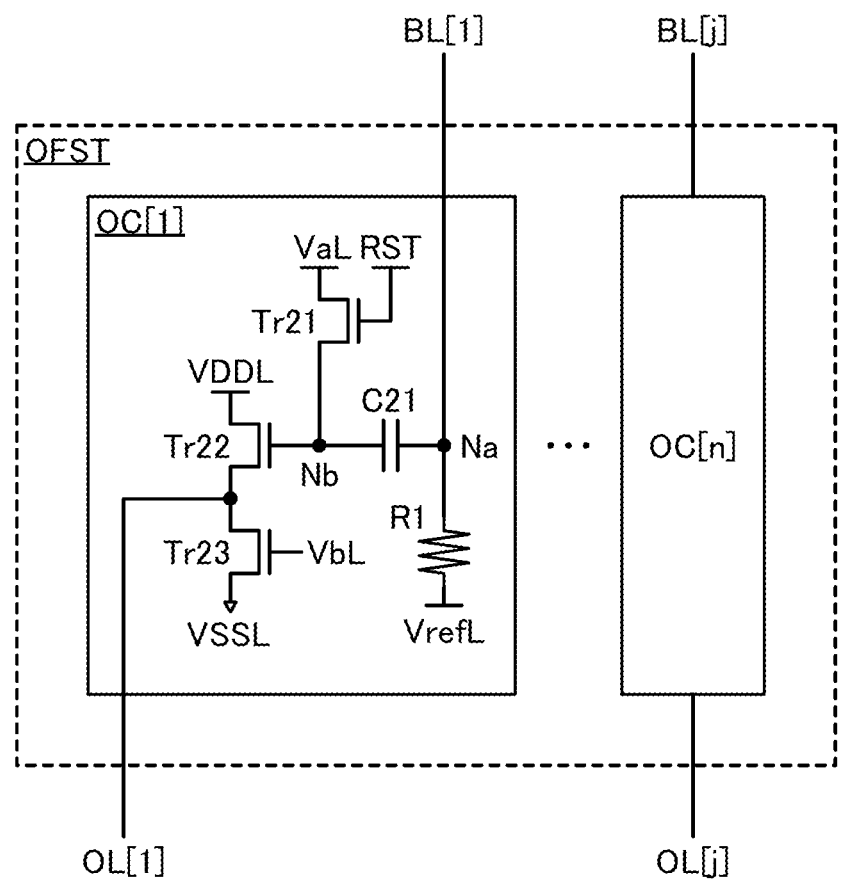
FIG. 30 A diagram illustrating a configuration example of an offset circuit.

FIG. 30 illustrates a configuration example of the offset circuit OFST. The offset circuit OFST illustrated in FIG. 30 includes circuits OC[1] to OC[n]. The circuits OC[1] to OC[n] each include a transistor Tr21, a transistor Tr22, a transistor Tr23, a capacitor C21, and a resistor R1. Connection relationships of the elements are as illustrated in FIG. 30. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power source potential and the potential VSS is a low power source potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] is described. Note that although an operation example of the circuit OC[1] is described here as a typical example, the circuits OC[2] to OC[n] can be operated in a similar manner. First, when a first current flows to the wiring BL[1], the potential of the node Na becomes a potential corresponding to the first current and the resistance value of the resistor R1. At this time, the transistor Tr21 is in an on state, and thus the potential Va is supplied to the node Nb. Then, the transistor Tr21 is turned off.

Next, when a second current flows to the wiring BL[1], the potential of the node Na changes to a potential corresponding to the second current and the resistance value of the resistor R1. At this time, since the transistor Tr21 is in an off state and the node Nb is in a floating state, the potential of the node Nb is changed owing to capacitive coupling, with the change in the potential of the node Na. Here, when the change in the potential of the node Na is $\Delta V_{Na}$ and the capacitive coupling coefficient is 1, the potential of the node Nb is Va+$\Delta V_{Na}$. When the threshold voltage of the transistor Tr22 is $V_{th}$, a potential Va+$\Delta V_{Na}$+$V_{th}$ is output through the wiring OL[1]. When Va=$V_{th}$, a potential $\Delta V_{Na}$ can be output through the wiring OL[1].

The potential $\Delta V_{Na}$ is determined by the amount of change from the first current to the second current, the resistor R1, and the potential Vref. Here, since the resistor R1 and the potential Vref are known, the amount of change in the current flowing to the wiring BL can be found from the potential $\Delta V_{Na}$.

A signal corresponding to the amount of a current and/or the amount of change in a current detected by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an operation for converting the signal input from the offset circuit OFST in accordance with a predefined activation function. As the activation function, a sigmoid function, a tanh function, a softmax function, a ReLU function, a threshold function, or the like can be used, for example. The signal converted by the activation function circuit ACTV is output as output data to the wirings NIL[1] to NIL[n].

Operation Example of Semiconductor Device

The product-sum operation of the first data and the second data can be performed with the above semiconductor device MAC. An operation example of the semiconductor device MAC at the time of performing the product-sum operation is described below.

Figure 31:
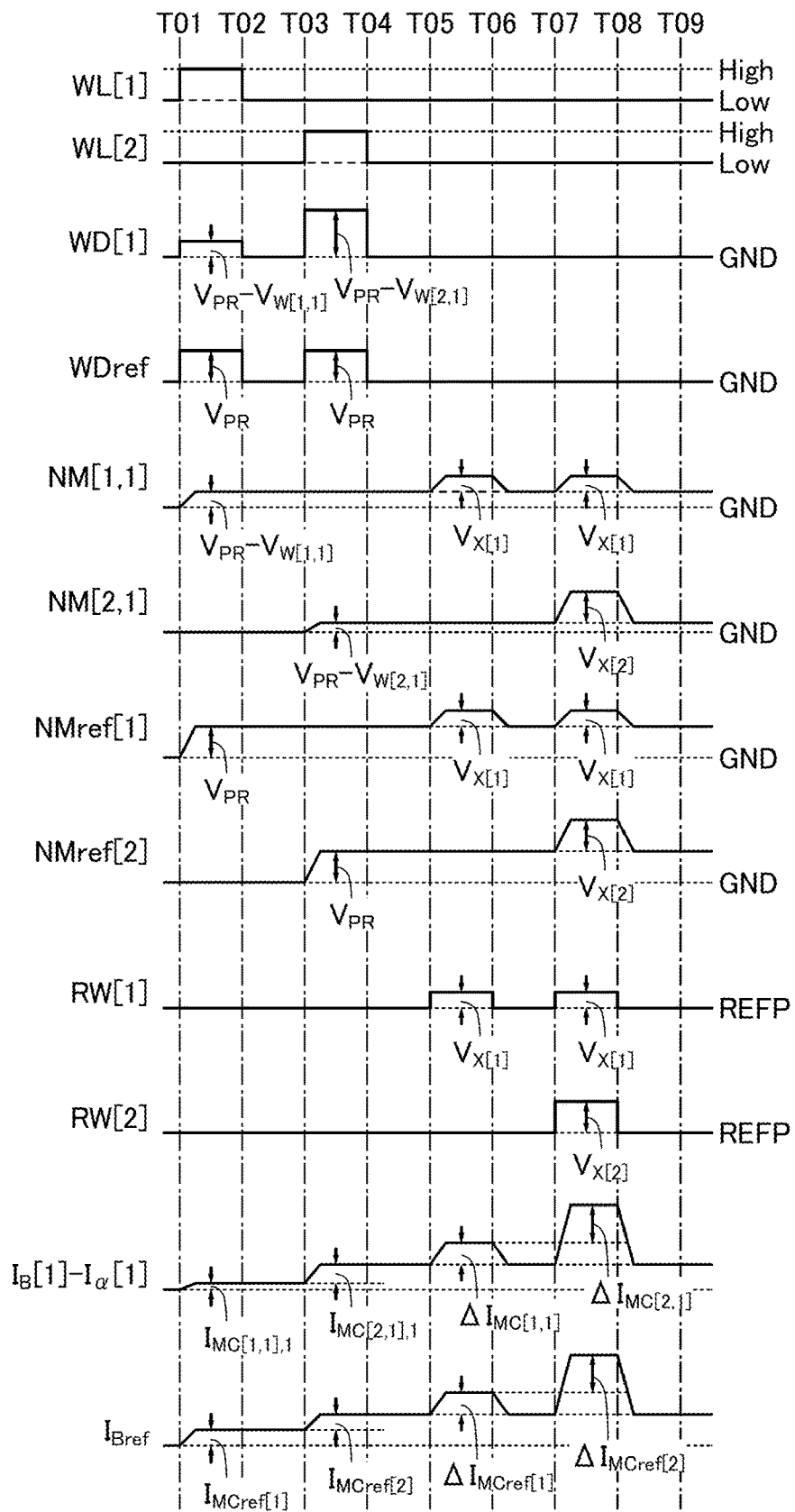
FIG. 31 A timing chart.

FIG. 31 shows a timing chart of the operation example of the semiconductor device MAC. FIG. 31 shows changes in the potentials of the wiring WL[1], the wiring WL[2], the wiring WD[1], and the wiring WDref, the node NM[1, 1], the node NM[2, 1], the node NMref[1], and the node NMref[2], and the wiring RW[1] and the wiring RW[2] in FIG. 29 and changes in the values of the current $I_B[1]-I_\alpha[1]$ and the current $I_{Bref}$. The current $I_B[1]-I_\alpha[1]$ corresponds to a total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] illustrated in FIG. 29 as a typical example, the other memory cells MC and the other memory cells MCref can also be operated in a similar manner.

[Storage of First Data]

First, from Time T01 to Time T02, the potential of the wiring WL[1] becomes a high level, the potential of the wiring WD[1] becomes a potential greater than a ground potential (GND) by $V_{PR}-V_{W[1,\ 1]}$, and the potential of the wiring WDref becomes a potential greater than the ground potential by $V_{PR}$. The potentials of the wiring RW[1] and the wiring RW[2] become reference potentials (REFP). Note that the potential $V_{w[1, 1]}$ is the potential corresponding to the first data stored in the memory cell MC[1, 1]. The potential VPR is the potential corresponding to the reference data. Thus, the transistors Tr11 included in the memory cell MC[1, 1] and the memory cell MCref[1] are turned on, and the potential of the node NM[1, 1] and the potential of the node NMref[1] become $V_{PR}-V_{w[1, 1]}$ and $V_{PR}$, respectively.

In this case, a current $I_{MC[1, 1], 0}$ flowing from the wiring BL[1] to the transistor Tr12 in the memory cell MC[1, 1] can be expressed by the formula shown below. Here, k is a constant determined by the channel length, the channel width, the mobility, the capacitance of a gate insulating film, and the like of the transistor Tr12. Furthermore, $V_{th}$ is the threshold voltage of the transistor Tr12.

$$I_{MC[1, 1],0}=k(V_{PR}-V_{w[1, 1]}-V_{th})^2 \quad (E1)$$

Furthermore, a current $I_{MCref[1], 0}$ flowing from the wiring BLref to the transistor Tr12 in the memory cell MCref[1] can be expressed by the formula shown below.

$$I_{MCref[1], 0}=k(V_{PR}-V_{th})^2 \quad (E2)$$

Next, from Time T02 to Time T03, the potential of the wiring WL[1] becomes a low level. Consequently, the transistors Tr11 included in the memory cell MC[1, 1] and the memory cell MCref[1] are turned off, and the potentials of the node NM[1, 1] and the node NMref[1] are held.

As described above, an OS transistor is preferably used as the transistor Tr11. This can suppress the leakage current of the transistor Tr11, so that the potentials of the node NM[1, 1] and the node NMref[1] can be accurately held.

Next, from Time T03 to Time T04, the potential of the wiring WL[2] becomes the high level, the potential of the wiring WD[1] becomes a potential greater than the ground potential by $V_{PR}-V_{w[2, 1]}$, and the potential of the wiring WDref becomes a potential greater than the ground potential by $V_{PR}$. Note that the potential $V_{w[2, 1]}$ is a potential corresponding to the first data stored in the memory cell MC[2, 1]. Thus, the transistors Tr11 included in the memory cell MC[2, 1] and the memory cell MCref[2] are turned on, and the potentials of the node NM[2, 1] and the node NMref[2] become $V_{PR}-V_{w[2, 1]}$ and $V_{PR}$, respectively.

Here, a current $I_{MC[2, 1], 0}$ flowing from the wiring BL[1] to the transistor Tr12 in the memory cell MC[2, 1] can be expressed by the formula shown below.

$$I_{MC[2, 1], 0}=k(V_{PR}-V_{w[2, 1]}-V_{th})^2 \quad (E3)$$

Furthermore, a current $I_{MCref[2], 0}$ flowing from the wiring BLref to the transistor Tr12 in the memory cell MCref[2] can be expressed by the formula shown below.

$$I_{MCref[2],0}=k(V_{PR}-V_{th})^2 \quad (E4)$$

Next, from Time T04 to Time T05, the potential of the wiring WL[2] becomes the low level. Consequently, the transistors Tr11 included in the memory cell MC[2, 1] and the memory cell MCref[2] are turned off, and the potentials of the node NM[2, 1] and the node NMref[2] are held.

Through the above operation, the first data is stored in the memory cells MC[1, 1] and MC[2, 1], and the reference data is stored in the memory cells MCref[1] and MCref[2].

Here, currents flowing through the wiring BL[1] and the wiring BLref from Time T04 to Time T05 are considered. A current from the current source circuit CS is supplied to the wiring BLref. The current flowing through the wiring BLref is discharged to the current mirror circuit CM and the memory cells MCref[1] and MCref[2]. The formula shown below holds where $I_{Cref}$ is the current supplied from the current source circuit CS to the wiring BLref and $I_{CM, 0}$ is the current discharged from the wiring BLref to the current mirror circuit CM.

$$I_{Cref}-I_{CM, 0}=I_{MCref[1], 0}+I_{MCref[2], 0} \quad (E5)$$

A current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{C, 0}$ is the current supplied from the current source circuit CS to the wiring BL[1] and $I_{\alpha, 0}$ is the current flowing from the wiring BL[1] to the offset circuit OFST.

$$I_C-I_{CM, 0}=I_{MC[1, 1], 0}+I_{MC[2, 1],0}+I_{\alpha,0} \quad (E6)$$

Product-Sum Operation of First Data and Second Data

Next, from Time T05 to Time T06, the potential of the wiring RW[1] becomes a potential greater than the reference potential by $V_{x[1]}$. At this time, the potential $V_{x[1]}$ is supplied to the capacitors C11 in the memory cell MC[1, 1] and the memory cell MCref[1], so that the potentials of the gates of the transistors Tr12 increase owing to capacitive coupling. Note that the potential $V_{x[1]}$ is the potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is 1. In practice, the potential $V_x$ can be determined in consideration of the capacitive coupling coefficient.

When the potential $V_{x[1]}$ is supplied to the capacitors C11 in the memory cell MC[1, 1] and the memory cell MCref[1], the potentials of the node NM[1, 1] and the node NMref[1] each increase by $V_{x[1]}$.

Here, a current $I_{MC[1, 1], 1}$ flowing from the wiring BL[1] to the transistor Tr12 in the memory cell MC[1, 1] from Time T05 to Time T06 can be expressed by the formula shown below.

$$I_{MC[1, 1], 1}=k(V_{PR}-V_{w[1, 1]}+V_{x[1]}-V_{th})^2 \quad (E7)$$

That is, when the potential $V_{x[1]}$ is supplied to the wiring RW[1], the current flowing from the wiring BL[1] to the transistor Tr12 in the memory cell MC[1, 1] increases by $\Delta I_{MC[1, 1]}=I_{MC[1, 1], 1}-I_{MC[1, 1], 0}$.

A current $I_{MCref[1], 1}$ flowing from the wiring BLref to the transistor Tr12 in the memory cell MCref[1] from Time T05 to Time T06 can be expressed by the formula shown below.

$$I_{MCref[1], 1}=k(V_{PR}+V_{x[1]}-V_{th})^2 \quad (E8)$$

That is, when the potential $V_{x[1]}$ is supplied to the wiring RW[1], the current flowing from the wiring BLref to the transistor Tr12 in the memory cell MCref[1] increases by $\Delta I_{MCref[1]}=I_{MCref[1], 1}-I_{MCref[1], 0}$.

Furthermore, currents flowing through the wiring BL[1] and the wiring BLref are considered. A current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM,1}$ is the current discharged from the wiring BLref to the current mirror circuit CM.

$$I_{Cref} - I_{CM,1} = I_{MCref[1],1} + I_{MCref[2],0} \quad (E9)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha,1}$ is the current flowing from the wiring BL[1] to the offset circuit OFST.

$$I_C - I_{CM,1} = I_{MC[1,1],1} + I_{MC[2,1],1} + I_{\alpha,1} \quad (E10)$$

In addition, from the formula (E1) to the formula (E10), a difference between the current $I_{\alpha,0}$ and the current $I_{\alpha,1}$ (differential current $\Delta I_\alpha$) can be expressed by the formula shown below.

$$\Delta I_\alpha = I_{\alpha,0} - I_{\alpha,1} = 2kV_{W[1,1]}V_{X[1]} \quad (E11)$$

Thus, the differential current $\Delta I_\alpha$ is a value corresponding to the product of the potentials $V_{w[1,1]}$ and $V_{X[1]}$.

After that, from Time T06 to Time T07, the potential of the wiring RW[1] becomes the ground potential, and the potentials of the node NM[1, 1] and the node NMref[1] become similar to the potentials thereof from Time T04 to Time T05.

Next, from Time T07 to Time T08, the potential of the wiring RW[1] becomes the potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitors C11 in the memory cell MC[1, 1] and the memory cell MCref[1], and the potentials of the node NM[1, 1] and the node NMref[1] each increase by $V_{X[1]}$ due to capacitive coupling. Furthermore, the potential $V_{X[2]}$ is supplied to the capacitors C11 in the memory cell MC[2, 1] and the memory cell MCref[2], and the potentials of the node NM[2, 1] and the node NMref[2] each increase by $V_{X[2]}$ due to capacitive coupling.

Here, the current $I_{MC[2,1],1}$ flowing from the wiring BL[1] to the transistor Tr12 in the memory cell MC[2, 1] from Time T07 to Time T08 can be expressed by the formula shown below.

$$I_{MC[2,1],1} = k(V_{PR} - V_{W[2,1]} + V_{X[2]} - V_{th})^2 \quad (E12)$$

That is, when the potential $V_{X[2]}$ is supplied to the wiring RW[2], the current flowing from the wiring BL[1] to the transistor Tr12 in the memory cell MC[2, 1] increases by $\Delta I_{MC[2,1]} = I_{MC[2,1],1} - I_{MC[2,1],0}$.

Here, a current $I_{MCref[2],1}$ flowing from the wiring BLref to the transistor Tr12 in the memory cell MCref[2] from Time T05 to Time T06 can be expressed by the formula shown below.

$$I_{MCref[2],1} = k(V_{PR} - V_{X[2]} - V_{th})^2 \quad (E13)$$

That is, when the potential $Vx_{[2]}$ is supplied to the wiring RW[2], the current flowing from the wiring BLref to the transistor Tr12 in the memory cell MCref[2] increases by $\Delta I_{MCref[2]} = I_{MCref[2],1} - I_{MCref[2],0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM,2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha,2}$ is the current flowing from the wiring BL[1] to the offset circuit OFST.

$$I_C - I_{CM,2} = I_{MC[1,1],1} + I_{MC[2,1],1} + I_{\alpha,2} \quad (E15)$$

In addition, from the formula (E1) to the formula (E8) and the formula (E12) to the formula (E15), a difference between the current $I_{\alpha,0}$ and the current $I_{\alpha,2}$ (differential current $\Delta I_\alpha$) can be expressed by the formula shown below.

$$\Delta I_\alpha = I_{\alpha,0} - I_{\alpha,2} = 2k(V_{W[1,1]}V_{X[1]} + V_{W[2,1]}V_{X[2]}) \quad (E16)$$

Thus, the differential current $\Delta I_\alpha$ is a value corresponding to the sum of the product of the potential $V_{W[1,1]}$ and the potential $V_{X[1]}$ and the product of the potential $V_{W[2,1]}$ and the potential $V_{X[2]}$.

After that, from Time T08 to Time T09, the potentials of the wirings RW[1] and RW[2] become the reference potential, and the potentials of the nodes NM[1, 1] and NM[2, 1] and the nodes NMref[1] and NMref[2] become similar to the potentials thereof from Time T04 to Time T05.

As represented by the formula (E9) and the formula (E16), the differential current $\Delta I_\alpha$ input to the offset circuit OFST is a value corresponding to the sum of the products of the potentials $V_X$ corresponding to the first data (weight) and the potentials $V_W$ corresponding to the second data (input data). Thus, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are particularly focused in the above description, the number of the memory cells MC and the memory cells MCref can be set to any number. In the case where the number m of rows of the memory cells MC and the memory cells MCref is an arbitrary number, the differential current $\Delta I_\alpha$ can be expressed by the formula shown below.

$$\Delta I_\alpha = 2k\Sigma_i V_{W[i,1]}V_{X[i]} \quad (E17)$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the configuration of the memory cells MC and the memory cells MCref in FIG. 29 allows the product-sum operation circuit to be formed of fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 27(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the configuration of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), or the like.

The product-sum operation of the neural network can be performed using the semiconductor device MAC as described above. Furthermore, the memory cells MC and the memory cells MCref illustrated in FIG. 29 are used for the cell array CA, which can provide an integrated circuit with improved operation accuracy, lower power consumption, or a reduced circuit scale.

This embodiment can be combined with the other embodiments as appropriate.

Example

In this example, layout design was performed using the method described in <2. Layout design method 1>.

In this example, a grid had a grid interval of 1 and a grid frame size of 20×20 (grid area: 400). Four abstracts were used and each abstract had a size of 3×3.

In Step S27 and Step S32, the discount rate γ was 0.95 in updating of the action value function $Q(s_t, a_t)$. The first neural network and the second neural network were optimized using Adam. The movement a was selected using an ε-greedy method. In one episode, ε was 1; after that, c was linearly decreased so that c was 0.1 in 80000 episodes. After 80000 episodes, c was 0.1.

In Step S33, the reward for a movement of an abstract was 1−(block area/400), and setting was such that the reward decreased as the block area increased. In Step S36, the reward was 0 in the case where the connection points were able to be connected and the design rule was satisfied, and the reward was −1 in the case where the connection points were not able to be connected or the design rule was not satisfied. The path between the connection points was determined by a line search method.

Figure 32:
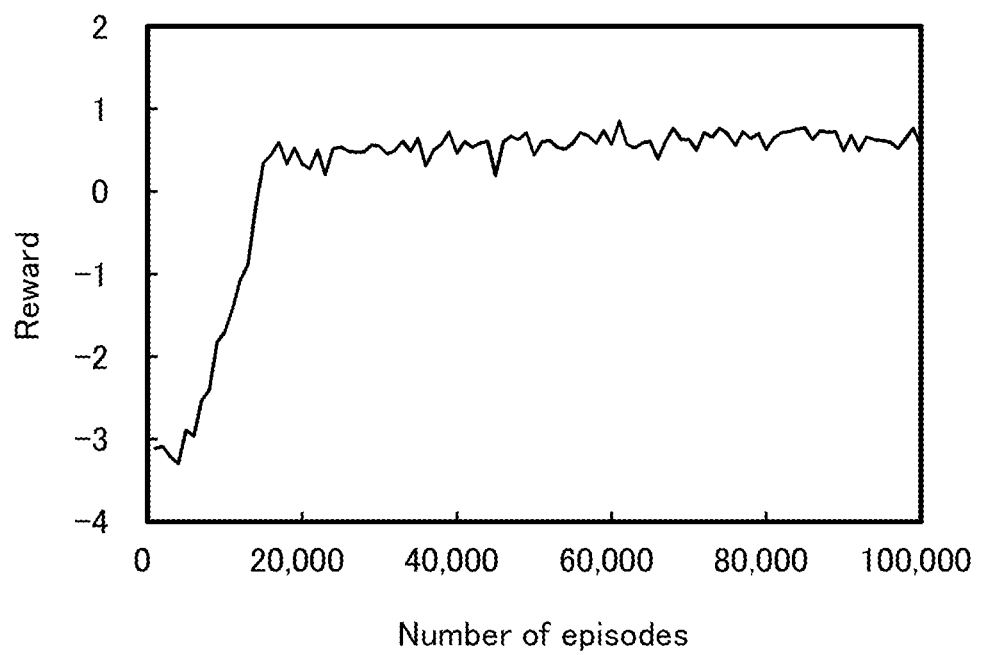
FIG. 32 A diagram showing a change in reward.

FIG. 32 shows the results of learning. The horizontal axis represents the number of episodes and the vertical axis represents reward in FIG. 32. As the reward, the average value of cumulative reward per 1000 episodes is shown.

As shown in FIG. 32, as the number of episodes increased, the cumulative reward increased. The cumulative reward saturated and the learning converged with approximately 20000 episodes. That is, it was confirmed that layout which satisfies the design rule and in which the abstracts can be connected to each other and the block area is the smallest can be learned.

REFERENCE NUMERALS

ABS: abstract, ABS_1: abstract, ABS_2: abstract, ABS_3: abstract, ABS_51: abstract, ABS_52: abstract, ABS_k: abstract, BLK: block, C11 capacitor, C21 capacitor, C52: capacitor, CP_1: connection point, CP_2: connection point, CP_3: connection point, CP_4: connection point, CP_11: connection point, CP_12: connection point, CP_13: connection point, CP_14: connection point, CP_15: connection point, CPL_2: connection point, CPL_3: connection point, CPL_4: connection point, ELM_1: basic cell, ELM_2: basic cell, ELM_3: basic cell, HL: intermediate layer, IL: input layer, $LIMG_t$: image data, $LIMG_{t+1}$: image data, $LIMG_t\_1$: image data, $LIMG_t\_2$: image data, MC: memory cell, MCref: memory cell, NN: neural network, OL: output layer, S11: step, S12: step, S13: step, S14: step, S15: step, S21: step, S22: step, S23: step, S24: step, S25: step, S26: step, S27: step, S28: step, S29: step, S30: step, S31: step, S32: step, S33: step, S34: step, S35: step, S36: step, S101: step, S102: step, S103: step, S104: step, S105: step, S106: step, S107: step, S108: step, S109: step, S110: step, Tr11: transistor, Tr12: transistor, Tr21: transistor, Tr22: transistor, Tr23: transistor, Tr51: transistor element, 90: memory cell array, 91: word line driver circuit, 92: bit line driver circuit, 100: layout design system, 101: input portion, 102: transmission path, 103: processing portion, 105: memory portion, 107: database, 109: output portion, 111 process information, 113 transistor parameter, 115 cell library, 117 design rule, 119 circuit diagram, 121 layout data, 123 grid information, 150: layout design system, 151: server, 152: terminal, 161a: communication portion, 161b: communication portion, 162: transmission path, 163a: processing portion, 163b: processing portion, 165: memory portion, 167: database, 168: transmission path, 169: input/output portion, 301: semiconductor layer, 303: gate electrode, 305: source electrode, 307: drain electrode, 309: upper electrode, 311: lower electrode, 320: region, 331_1: connection region, 331_2: connection region, 331_3: connection region, 331_4: connection region, 331_5: connection region, 341: circuit diagram, 520: neural network, 521: input layer, 522: intermediate layer, 523: output layer, 524: convolution layer, 525: pooling layer, 526: convolution layer, 527: pooling layer, 528: convolution layer, 529: fully-connected layer, 530: neural network, 531: input layer, 532: intermediate layer, 533: output layer, 534: convolution layer, 535: pooling layer, 536: convolution layer, 537: pooling layer, 538: convolution layer, 539: fully-connected layer, 601: grid frame, 603: grid

The invention claimed is:

1. A layout design system comprising a processing portion,
   wherein a circuit diagram and layout design information are input to the processing portion,
   wherein the processing portion has a function of generating layout data from the circuit diagram and the layout design information by performing a Q learning,
   wherein the processing portion has a function of outputting the layout data,
   wherein the processing portion comprises a first neural network, and
   wherein the first neural network estimates an action value function in the Q learning.

2. The layout design system according to claim 1, wherein the first neural network is a convolutional neural network.

3. The layout design system according to claim 1,
   wherein the processing portion further comprises a second neural network,
   wherein the second neural network estimates teacher data for the action value function, and
   wherein a weight coefficient of the first neural network is updated in accordance with a loss function calculated from the teacher data.

4. The layout design system according to claim 3, wherein the second neural network is a convolutional neural network.

5. The layout design system according to claim 1,
wherein the processing portion comprises a transistor, and
wherein the transistor comprises a metal oxide in a channel formation region.

6. The layout design system according to claim 1,
wherein the processing portion comprises a transistor, and
wherein the transistor comprises silicon in a channel formation region.

7. A layout design system comprising a terminal and a server,
wherein the terminal comprises an input/output portion and a first communication portion,
wherein the server comprises a processing portion and a second communication portion,
wherein a circuit diagram and layout design information are input to the input/output portion,
wherein the first communication portion has a function of supplying the circuit diagram and the layout design information to the server by one or both of a wire communication and a wireless communication,
wherein the processing portion has a function of generating layout data from the circuit diagram and the layout design information by performing a Q learning,
wherein the processing portion has a function of supplying the layout data to the second communication portion,
wherein the second communication portion has a function of supplying the layout data to the terminal by one or both of a wire communication and a wireless communication,
wherein the processing portion comprises a first neural network, and
wherein the first neural network estimates an action value function in the Q learning.

8. The layout design system according to claim 7, wherein the first neural network is a convolutional neural network.

9. The layout design system according to claim 7,
wherein the processing portion further comprises a second neural network,
wherein the second neural network estimates teacher data for the action value function, and
wherein a weight coefficient of the first neural network is updated in accordance with a loss function calculated from the teacher data.

10. The layout design system according to claim 9, wherein the second neural network is a convolutional neural network.

11. The layout design system according to claim 7,
wherein the processing portion comprises a transistor, and
wherein the transistor comprises a metal oxide in a channel formation region.

12. The layout design system according to claim 7,
wherein the processing portion comprises a transistor, and
wherein the transistor comprises silicon in a channel formation region.

13. A layout design method comprising:
inputting a circuit diagram and layout design information;
performing a Q learning from the circuit diagram and the layout design information to generate layout data;
estimating an action value function using a first neural network in the Q learning; and
outputting the layout data.

14. The layout design method according to claim 13, further comprising:
estimating teacher data for the action value function using a second neural network, and
updating a weight coefficient of the first neural network in accordance with a loss function calculated from the teacher data.

* * * * *